(12) United States Patent
Morita et al.

(10) Patent No.: US 10,546,073 B2
(45) Date of Patent: Jan. 28, 2020

(54) COMMUNICATION SIMULATING SYSTEM, COMMUNICATION SIMULATING METHOD, AND VEHICLE COMMUNICATION APPARATUS

(71) Applicant: HONDA MOTOR CO., LTD., Tokyo (JP)

(72) Inventors: Yosuke Morita, Tochigi (JP); Katsunori Miyazawa, Tochigi (JP); Yuki Harada, Tochigi (JP); Yuichiro Ikeda, Tochigi (JP); Akiei Satani, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 711 days.

(21) Appl. No.: 14/383,162

(22) PCT Filed: Mar. 8, 2013

(86) PCT No.: PCT/JP2013/056534
§ 371 (c)(1),
(2) Date: Sep. 5, 2014

(87) PCT Pub. No.: WO2013/133431
PCT Pub. Date: Sep. 12, 2013

(65) Prior Publication Data
US 2015/0046133 A1 Feb. 12, 2015

(30) Foreign Application Priority Data
Mar. 9, 2012 (JP) .................................. 2012-052529

(51) Int. Cl.
*G06F 17/50* (2006.01)
*B60W 50/04* (2006.01)

(52) U.S. Cl.
CPC ......... *G06F 17/5009* (2013.01); *B60W 50/04* (2013.01); *B60W 2050/046* (2013.01)

(58) Field of Classification Search
CPC .............. G06F 17/5009; B60W 50/04; B60W 2050/046
See application file for complete search history.

(56) References Cited

U.S. PATENT DOCUMENTS

2003/0055674 A1* 3/2003 Nishiyama ............. G06Q 10/06
703/8
2003/0220722 A1* 11/2003 Toba ....................... G10K 15/02
701/1

(Continued)

FOREIGN PATENT DOCUMENTS

| CN | 101464485 | 6/2009 |
|----|-----------|--------|
| CN | 201348737 | 11/2009 |

(Continued)

OTHER PUBLICATIONS

Chinese Office Action dated Dec. 15, 2015, 10 pages.
International Search Report dated May 21, 2013, Application No. PCT/JP2013/056534; English translation included.

*Primary Examiner* — Doon Y Chow
*Assistant Examiner* — Carina Yun
(74) *Attorney, Agent, or Firm* — Rankin, Hill & Clark LLP

(57) ABSTRACT

A communication simulating system includes: a communication recording device that records, into a vehicle condition database, a vehicle condition including a step, a place and a vehicle stringed together, vehicle state information that has been input as communication content between a vehicle electric equipment system and a vehicle communication apparatus in a step performed at a predetermined place; a vehicle state information acquiring device that acquires vehicle state information from the vehicle condition data- (Continued)

base in accordance with a selected vehicle condition; a storage unit that stores communication definition files specifying the respective ones of the same processes as the communication processes executed by a plurality of ECUs included in the vehicle electric equipment system; and a communication control device that communicates with a vehicle communication apparatus in accordance with the communication process and the vehicle state information.

25 Claims, 15 Drawing Sheets

(56) References Cited

U.S. PATENT DOCUMENTS

| | | | |
|---|---|---|---|
| 2005/0075759 A1* | 4/2005 | Furuta | G11B 27/34 701/1 |
| 2005/0228556 A1* | 10/2005 | Kojima | B60K 37/02 701/31.4 |
| 2006/0111826 A1* | 5/2006 | Akiyama | B60Q 1/12 701/48 |
| 2006/0149434 A1* | 7/2006 | Bertosa | G07C 5/006 701/31.4 |
| 2008/0033684 A1* | 2/2008 | Vian | F41G 7/303 702/113 |

FOREIGN PATENT DOCUMENTS

| | | |
|---|---|---|
| JP | 11-14507 | 1/1999 |
| JP | 2003-121310 | 4/2003 |
| JP | 2004-85445 | 3/2004 |
| JP | 2005-164416 | 6/2005 |
| JP | 2005-181113 | 7/2005 |
| JP | 2009-145298 | 7/2009 |

* cited by examiner

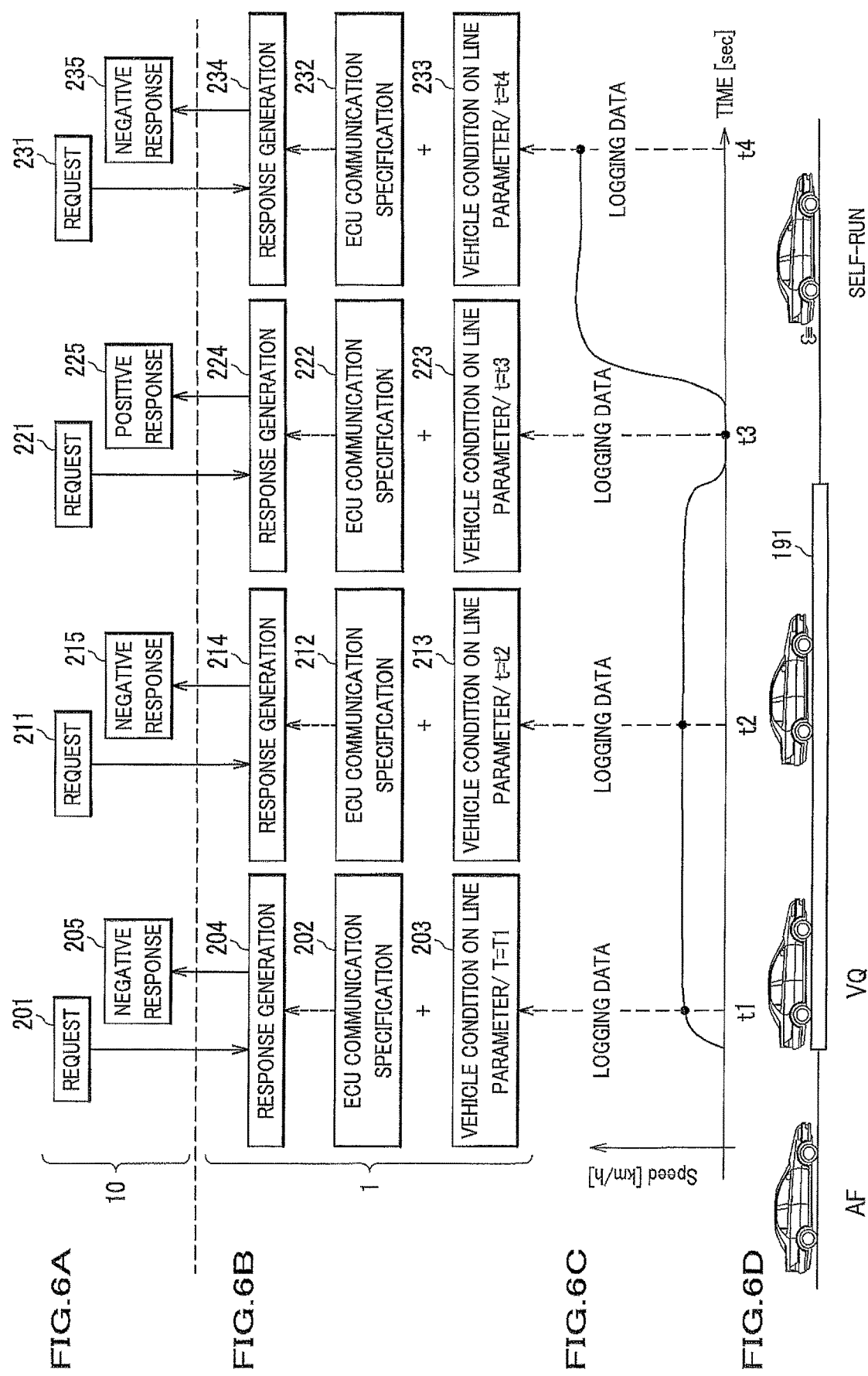

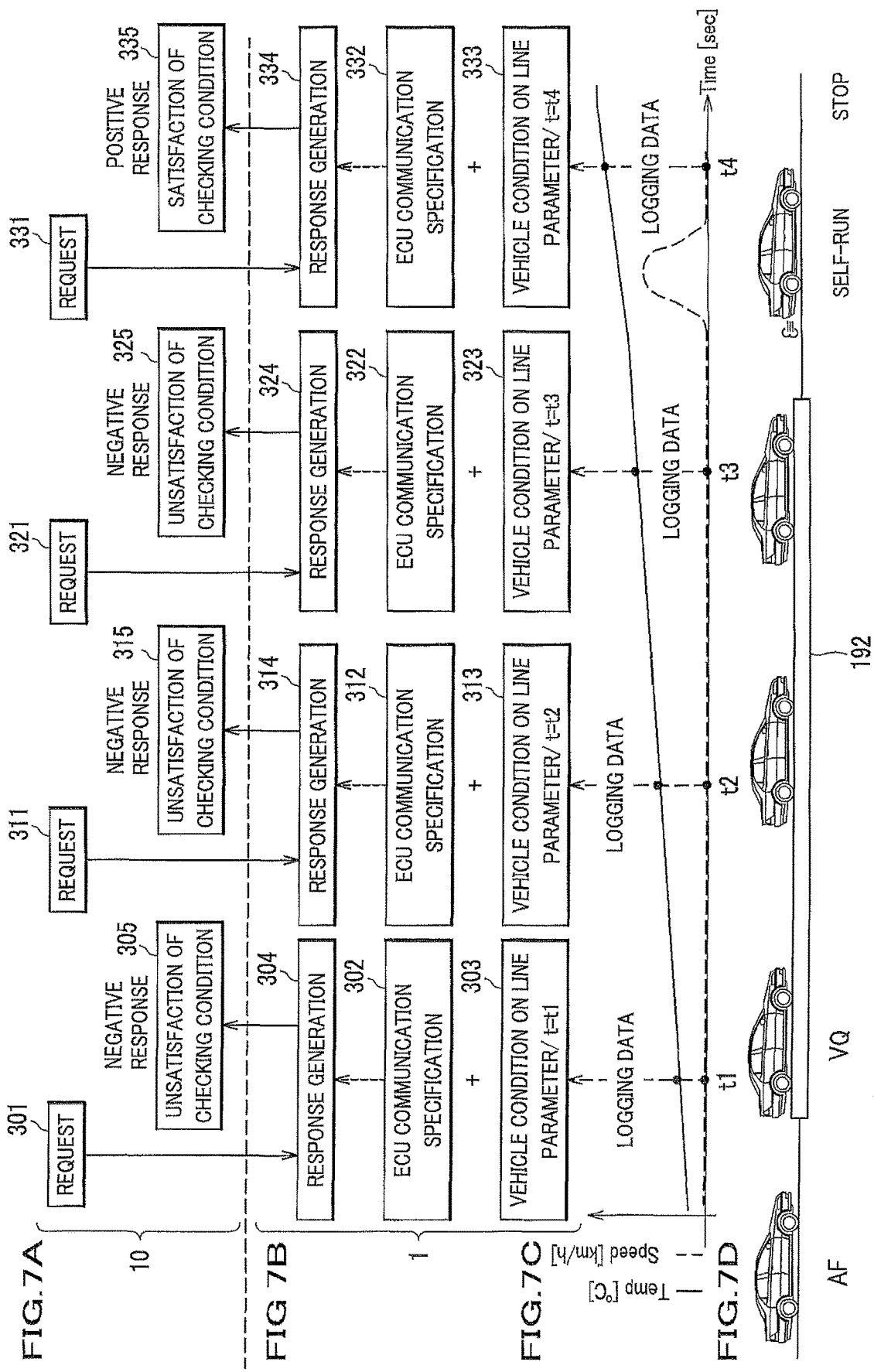

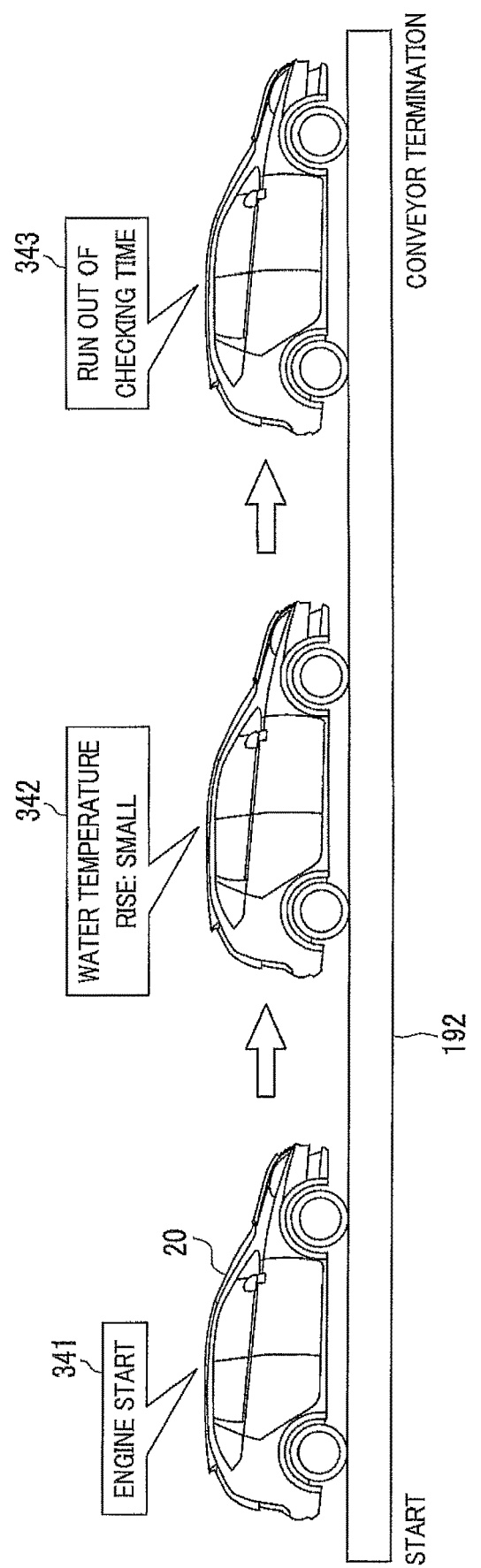

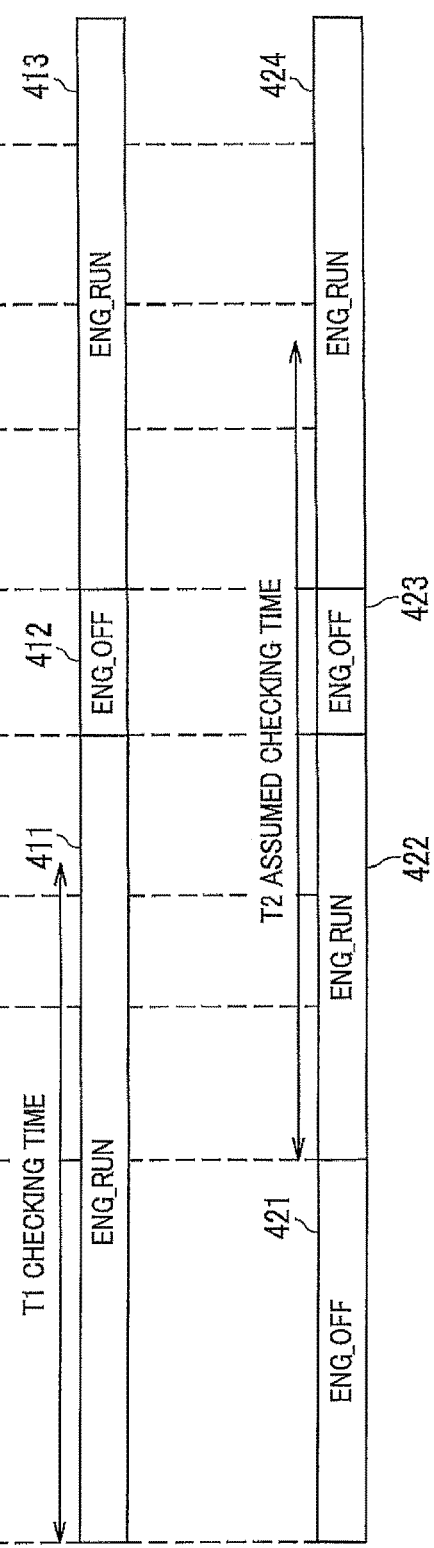

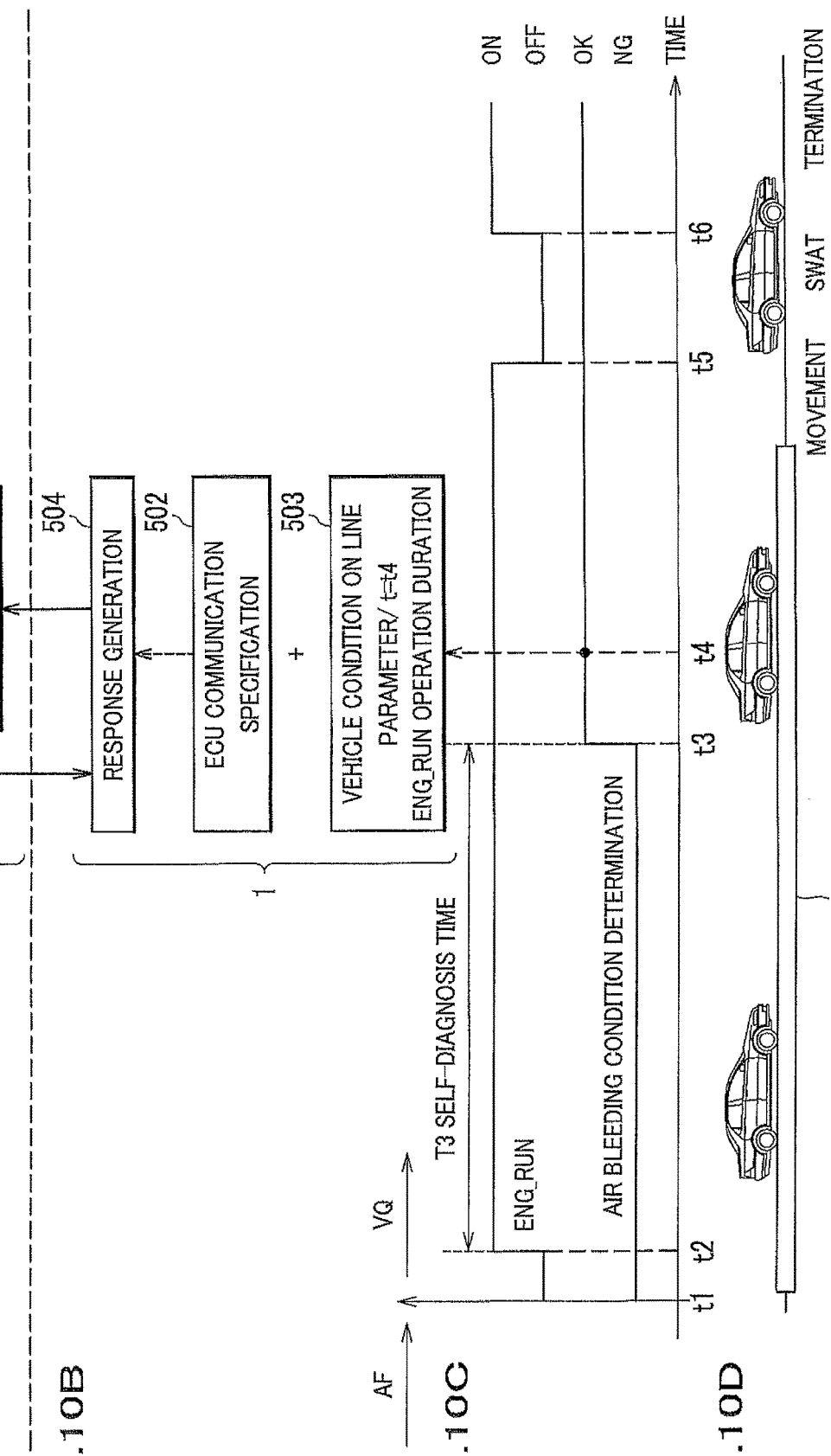

COMMUNICATION SIMULATING SYSTEM, COMMUNICATION SIMULATING METHOD, AND VEHICLE COMMUNICATION APPARATUS

TECHNICAL FIELD

The present invention relates to a technology for checking the operation of electrical systems of a vehicle, and particularly relates to a communication simulating system, a communication simulating method, and a vehicle communication apparatus which simulate communication by electrical systems of a vehicle.

BACKGROUND ART

Conventionally, in order to check the operation of the electrical systems of a vehicle, such as an automobile, vehicle communication related to learning, writing-in, and checking is performed with the vehicle electrical systems. Vehicle communication related to learning is vehicle communication for making components, including ECUs (Electronic Control Units) included in the vehicle electrical systems, learn (store) in advance communication commands and operations corresponding to the communication commands. Vehicle communication related to writing-in is vehicle communication for writing-in data, which is necessary for normal operation of the ECUs, the electrical systems, and components configured by these, into corresponding memories or the like of the electrical systems. Vehicle communication related to checking is checking communication for checking the operation state of the vehicle electrical systems and the like by a vehicle communication apparatus connected to the vehicle electrical systems from outside of the vehicle.

In general, various kinds of electrical components mounted on an automobile are controlled by onboard ECUs, corresponding to respective vehicle states detected by onboard sensors. Prior to shipment of such onboard electrical components, it is necessary to test whether or not the respective onboard electrical components are ensured to operate in a state of being actually mounted on a vehicle. Conventionally, known is an onboard electrical component testing system (for example, see Patent Document 1) for such onboard electrical components. The onboard electrical component testing system described in Patent Document 1 performs tests of operation of various onboard electrical components by performing simulations on a simulated entire vehicle, connecting two communication line systems.

In producing automobiles, for example, there is a case that production of vehicles of a vehicle model, which has been produced at a first base provided with a certain line for checking, is shifted to a second base provided with a different line. In producing vehicles at such a second base, there is also a case that a vehicle model is developed, with new specifications of ECUs. In these cases, normally, before a start of mass-production, a vehicle is carried to a line, line adaptability, implementability of various checking processes, and the like are confirmed. That is, it is confirmed whether communication with the respective ECUs of an actual vehicle transported on a current line is successful and this vehicle can be produced on the current line without a problem. In such a manner, in order to carry out detailed verification of a process on a line, using an actual vehicle, the checking is usually carried out in a late stage of a period of product development. Further, even when the production base is the same, verification of a process is necessary in case of modifying the specifications of electrical systems for a new vehicle model or the like.

Background Art Document

Patent Document

Patent Document 1: Japanese Patent Application Publication No. 2005-181113

DISCLOSURE OF THE INVENTION

Problem to be Solved by the Invention

In detailed verification of a process, using an actual vehicle, when a failure of the layout of a line or the like has occurred, man-hours for reconsidering a process layout, re-verifying a modified process, or the like becomes necessary. In this case, it may occur that a sufficient period before mass production is not ensured, and as a result, production on an optimum process layout cannot be carried out. In this situation, it is desired to reduce wasteful man-hours and structure an optimum process layout.

Further, for electrical systems for onboard components, a process of making the electrical system learn operation in advance and a process of writing-in necessary data are necessary in assembling a vehicle, and accordingly, it is necessary to verify whether it is possible to implement the learning process and the writing process on a production line, each time product specifications or the production base is changed, similarly to the above-described checking process. Accordingly, reduction in man-hours for this checking is desired.

In this situation, verifying a process, by simulation is considered. However, the onboard electrical component testing system described in Patent Document 1 performs a test of operation of onboard electrical components by simulation on a simulated model of the entire vehicle, and does not allow verifying the implementability of a process on a line.

In this situation, in order to solve the above described problem, an object of the present invention is to provide a communication simulating system, a communication simulating method, and a vehicle communication apparatus which enable simulation of communication without using an actual vehicle.

Means for Solving the Problem

In order to solve the above-described problem, a communication simulating system in a first aspect of the present invention is a communication simulating system that simulates communication performed between plural vehicle electrical systems mounted on a vehicle and a vehicle communication apparatus, the vehicle communication apparatus being connected from outside of the vehicle to the plural vehicle electrical systems to check operation state of the respective vehicle electrical systems, the respective each communication being performed according to a communication process specified by a corresponding certain communication definition file and vehicle state information in at least one kind representing vehicle state detected on a vehicle side at respective time points, the communication simulating system including: a communication content input unit for inputting respective vehicle state information as content of communication between the vehicle electrical systems and the vehicle communication apparatus in respective processes performed at a certain place; a communication recording unit for recording the respective inputted vehicle state information into a vehicle condition database as vehicle condition, associating the vehicle state information with the corresponding process, the place, and the vehicle; a storage unit for storing communication definition files that are the same as respective communication definition files specifying communication processes to be executed in respective certain processes by plural electronic control units included in the vehicle electrical systems; a vehicle state information obtaining unit for obtaining vehicle state information from the vehicle condition database, corresponding to selected vehicle condition; and a communication control unit that obtains a communication definition file from the storage unit, corresponding to a selected process, and performs a communication process with the vehicle communication apparatus on selected vehicle condition in the selected process, according to a communication process specified by the obtained communication definition file and vehicle state information obtained from the vehicle condition database correspondingly to the selected vehicle condition.

By this arrangement, the communication simulating system in the first aspect inputs vehicle state information by the communication content unit. Herein, vehicle state information is information representing vehicle state information detected on the vehicle side at respective time points in a process performed at a certain place. The communication content input unit inputs respective vehicle state information detected in a checking process to be performed on individual vehicles at different checking places. Then, the communication simulating system records the respective vehicle state information by the communication recording unit into the vehicle condition database. Then, the communication simulating system stores communication definition files specifying communication processes to be executed in certain processes by the electronic control units into the storage units. The communication simulating system obtains vehicle state information from the vehicle condition database by the vehicle state information obtaining unit, corresponding to selected vehicle condition. Herein, the obtained vehicle state information refers to information at respective time points detected at a place specified by the vehicle condition. Then, the communication simulating system performs communication with the vehicle communication apparatus by the communication control unit. Herein, the communication control unit reflects the vehicle state information obtained from the vehicle condition database, and performs a communication process specified in the communication definition file obtained from the storage unit, corresponding to a selected process. Thus, the communication simulating system reproduces the vehicle state information in a process at a place specified by the selected vehicle condition. Accordingly, the communication simulating system can simulate, without an actual vehicle, communication state of communication performed between the vehicle electrical systems mounted on the vehicle and the vehicle communication apparatus.

Further, a communication simulating system according to the present invention is preferably arranged such that communication in a process performed at the certain place is one of checking communication that the vehicle communication apparatus performs to check operation of the vehicle electrical systems, learning communication for the vehicle communication apparatus to perform learning, and writing-in communication for the vehicle communication apparatus to write in data.

A communication simulating system in a second aspect of the invention is a communication simulating system that simulates checking communication performed between plural vehicle electrical systems mounted on a vehicle and a vehicle communication apparatus and between the vehicle communication apparatus and information processing terminal devices attached to equipment for managing necessary information at certain respective checking places, the vehicle communication apparatus being connected from outside of the vehicle to the plural vehicle electrical systems to check operation state of the respective vehicle electrical systems and being communicatably and wirelessly connected with the information processing terminal devices, the respective checking communication being performed according to a communication process specified by a corresponding certain communication definition file and vehicle state information in at least one kind representing vehicle state detected on a vehicle side at respective time points, the communication simulating system including: a communication content input unit for inputting vehicle state information as content of communication between the vehicle electrical systems, the information processing terminal devices, and the vehicle communication apparatus, in checking processes performed at certain respective checking places; a communication recording unit for recording the inputted vehicle state information into a vehicle condition database as vehicle condition, associating the respective inputted vehicle state information with the corresponding checking process, the corresponding checking place, and the vehicle; a storage unit for storing communication definition files that are the same as respective communication definition files specifying communication processes to be executed in certain respective checking processes by plural electronic control units included in the respective electrical systems and the information processing terminal devices; a vehicle state information obtaining unit for obtaining vehicle state information from the vehicle condition database, corresponding to selected vehicle condition; and a communication control unit that obtains a communication definition file from the storage unit, corresponding to a selected checking process, and performs in parallel a wired communication process executed by an electronic control unit on selected vehicle condition in the selected checking process, according to a communication process specified by the obtained corresponding communication definition file and vehicle state information obtained from the vehicle condition database correspondingly to the selected vehicle condition, and a wireless communication process executed by the corresponding information processing terminal device in this checking process, wherein the communication processes performed in parallel are performed with the vehicle communication apparatus.

By this arrangement, the communication simulating system in the second aspect inputs vehicle state information as content of communication between the vehicle electrical systems, the vehicle processing terminal devices, and the vehicle communication apparatus by the communication content input unit. Then, the communication simulating system records the respective vehicle state information into the vehicle condition database by the communication recording unit. Then, the communication simulating system stores communication definition files specifying communication processes to be executed in certain checking processes by the electronic control units and the information processing terminal devices, into the storage unit. Then, the communication simulating system obtains vehicle state information from the vehicle condition database by the vehicle state information obtaining unit, corresponding to selected vehicle condition. The communication simulating system performs communication with the vehicle communication apparatus by the communication control unit. The communication control unit then reflects the vehicle state information obtained from the vehicle condition database, and performs a communication process specified by a communication definition file obtained from the storage unit corresponding to a selected checking process. Thus, the communication simulating system reproduces in parallel a wired communication process executed by an electronic communication unit in a checking process at a checking place specified by selected vehicle condition and a wireless communication process executed by an information processing terminal device in this checking process. Accordingly, the communication simulating system can simulate communication performed between an onboard vehicle electrical systems and the vehicle communication apparatus without an actual vehicle, and can also simulate communication performed between an information processing terminal device attached to equipment for managing necessary information at a certain checking place and the vehicle communication apparatus.

Further, a communication simulating system according to the present invention is preferably arranged such that vehicle state information is information of vehicle state affected by at least one of equipment and environment of an individual place.

By this arrangement, even when vehicle condition is different depending on the place, the communication simulating system enables simulation of the communication state of communication performed between an onboard vehicle electrical system or the like and the vehicle communication apparatus without an actual vehicle.

Further, a communication simulating system according to the present invention is preferably arranged such that the communication control unit performs communication process with the vehicle communication apparatus on the selected vehicle condition, using virtual vehicle state information, in the at least one kind, that is generated with reflection of an amount of change assumed on vehicle state information in the at least one kind.

By this arrangement, the communication simulating system enables simulation of communication using virtual vehicle state information with reflection of an amount of change assumed on vehicle state information obtained previously from an actual vehicle. Accordingly, it is not only possible to perform faithful simulation by data obtained previously, but also possible to verify the implementability of a process by simulation flexibly changing obtained data.

Still further, a communication simulating system according to the present invention is preferably arranged such that: using a certain numerical value transformation rule that is obtained in advance from comparison between vehicle state information included in communication content detected by a vehicle of one model and vehicle state information included in communication content detected by a vehicle of a similar model similar to the one model, the virtual vehicle state information is generated by numerical transformation of the vehicle state information included in the communication content detected by the vehicle of the one model; and, using the virtual vehicle state information, the communication control unit simulates communication content with which a vehicle of another model responds to a request from the vehicle communication apparatus, the communication content reflecting an amount of change from the one model.

Yet further, a communication simulating system according to the present invention is preferably arranged such that: the virtual vehicle state information is virtual communication information generated in association with the vehicle state information included in the communication content detected by the vehicle; and, using the virtual vehicle state information, the communication control unit simulates communication content with which a vehicle having detected communication content including the vehicle state information responds to a request from the vehicle communication apparatus.

Further, a communication simulating system according to the present invention is preferably arranged such that: the virtual vehicle state information is generated by numerical transformation that adds or subtracts a numerical value required by a prescribed specific command from the vehicle communication apparatus, to or from vehicle state information included in communication content detected by the vehicle; and, using the virtual vehicle state information, the communication control unit simulates communication content with which a vehicle having detected communication content including the vehicle state information responds to the specific command from the vehicle communication apparatus.

Further, in order to solve the above-described problem, a communication simulating method in the first aspect of the present invention is a communication simulating method by a communication simulating system that simulates communication performed between plural vehicle electrical systems mounted on a vehicle and a vehicle communication apparatus, the vehicle communication apparatus being connected from outside of the vehicle to the plural vehicle electrical systems to check operation state of the respective vehicle electrical systems, the respective each communication being performed according to a communication process specified by a corresponding certain communication definition file and vehicle state information in at least one kind representing vehicle state detected on a vehicle side at respective time points, wherein the communication simulating system includes: a storage unit for storing communication definition files that are the same as respective communication definition files specifying communication processes to be executed in respective certain processes by plural electronic control units included in the vehicle electrical systems; and a processing unit, wherein the processing unit executes: a communication content input step of inputting respective vehicle state information as content of communication between the vehicle electrical systems and the vehicle communication apparatus in respective processes performed at a certain place; a communication recording step of recording the respective inputted vehicle state information into a vehicle condition database as vehicle condition, associating the vehicle state information with the corresponding process, the place, and the vehicle; a vehicle state information obtaining step of obtaining vehicle state information from the vehicle condition database, corresponding to selected vehicle condition; and a communication control step of obtaining a communication definition file from the storage unit, corresponding to a selected process, and performing a communication process with the vehicle communication apparatus on selected vehicle condition in the selected process, according to a communication process specified by the obtained communication definition file and vehicle state information obtained from the vehicle condition database correspondingly to the selected vehicle condition.

Still further, a communication simulating method according to the present invention is preferably arranged such that communication in a process performed at the certain place is one of checking communication that the vehicle communication apparatus performs to check operation of the vehicle electrical systems, learning communication for the vehicle communication apparatus to perform learning, and writing-in communication for the vehicle communication apparatus to write in data.

Yet further, a communication simulating method in the second aspect of the present invention is a communication simulating method by a communication simulating system that simulates checking communication performed between plural vehicle electrical systems mounted on a vehicle and a vehicle communication apparatus and between the vehicle communication apparatus and information processing terminal devices attached to equipment for managing necessary information at certain respective checking places, the vehicle communication apparatus being connected from outside of the vehicle to the plural vehicle electrical systems to check operation state of the respective vehicle electrical systems and being communicatably and wirelessly connected with the information processing terminal devices, the respective checking communication being performed according to a communication process specified by a corresponding certain communication definition file and vehicle state information in at least one kind representing vehicle state detected on a vehicle side at respective time points, wherein the communication simulating system includes: a storage unit for storing communication definition files that are the same as respective communication definition files specifying communication processes to be executed in certain respective checking processes by plural electronic control units included in the respective electrical systems and the information processing terminal devices; and a processing unit, wherein the processing unit executes: a communication content input step of inputting vehicle state information as content of communication between the vehicle electrical systems, the information processing terminal devices, and the vehicle communication apparatus, in checking processes performed at certain respective checking places; a communication recording step of recording the inputted vehicle state information into a vehicle condition database as vehicle condition, associating the respective inputted vehicle state information with the corresponding checking process, the corresponding checking place, and the vehicle; a vehicle state information obtaining step of obtaining vehicle state information from the vehicle condition database, corresponding to selected vehicle condition; and a communication control step of obtaining a communication definition file from the storage unit, corresponding to a selected checking process, and performing in parallel a wired communication process executed by an electronic control unit on selected vehicle condition in the selected checking process, according to a communication process specified by the obtained corresponding communication definition file and vehicle state information obtained from the vehicle condition database correspondingly to the selected vehicle condition, and a wireless communication process executed by the corresponding information processing terminal device in this checking process, wherein the communication processes performed in parallel are performed with the vehicle communication apparatus.

Further, a communication simulating method according to the present invention is preferably arranged such that the vehicle state information is information of vehicle state affected by at least one of equipment and environment of an individual place.

Still further, a communication simulating method according to the present invention is preferably arranged such that in the communication control step, the processing unit performs communication process with the vehicle communication apparatus on the selected vehicle condition, using virtual vehicle state information, in the at least one kind, that is generated with reflection of an amount of change assumed on vehicle state information in the at least one kind.

Yet further, a communication simulating method according to the present invention is preferably arranged such that, using a certain numerical value transformation rule that is obtained in advance from comparison between vehicle state information included in communication content detected by a vehicle of one model and vehicle state information included in communication content detected by a vehicle of a similar model similar to the one model, the virtual vehicle state information is generated by numerical transformation of the vehicle state information included in the communication content detected by the vehicle of the one model, and wherein, in the communication control step, using the virtual vehicle state information, the processing unit simulates communication content with which a vehicle of another model responds to a request from the vehicle communication apparatus, the communication content reflecting an amount of change from the one model.

Further, a communication simulating method according to the present invention is preferably arranged such that: the virtual vehicle state information is virtual communication information generated in association with the vehicle state information included in the communication content detected by the vehicle; and, in the communication control step, using the virtual vehicle state information, the processing unit simulates communication content with which a vehicle having detected communication content including the vehicle state information responds to a request from the vehicle communication apparatus.

Still further, a communication simulating method according to the present invention is preferably arranged such that: the virtual vehicle state information is generated by numerical transformation that adds or subtracts a numerical value required by a prescribed specific command from the vehicle communication apparatus, to or from vehicle state information included in communication content detected by the vehicle; and, in the communication control step, using the virtual vehicle state information, the processing unit simulates communication content with which a vehicle having detected communication content including the vehicle state information responds to the specific command from the vehicle communication apparatus.

Further, in order to solve the above-described problem, a vehicle communication apparatus according to the present invention is a vehicle communication apparatus that is communicatably wire-connected to plural vehicle electrical systems mounted on a vehicle from outside of the vehicle via a vehicular interface and is communicatably and wirelessly connected with information processing terminal devices attached to equipment for managing necessary information at respective checking places, the apparatus including: a communication simulation system interface communicatably connected with the communication simulating system according to the above, wherein the apparatus transmits an inquiry as to whether or not a selected process is implementable, based on the vehicle state information at a certain place, to the communication simulating system via the communication simulating system interface, and wherein the apparatus receives a response, to the inquiry, from the communication simulating system via the communication simulating system interface.

By this arrangement, the vehicle communication apparatus is provided with a vehicular interface for connecting onboard plural vehicle electrical systems, and a communication simulating system interface for connection with the communication simulating system. Thus, the vehicle communication apparatus performs communication with the communication simulating system via the communication simulating system interface to enable simulation of communication with a vehicle via the vehicular interface and simulation of communication with information processing terminals.

Advantages of the Invention

It is possible to simulate communication without an actual vehicle by a communication simulating system and method according to the present invention. Accordingly, in developing a vehicle communication apparatus, checking without an actual vehicle and checking of change in communication at respective production bases can be realized. As a result, it is possible to reduce the cost of developing a vehicle communication apparatus and shorten the development period.

BRIEF DESCRIPTION OF THE DRAWINGS

FIGS. 1A and 1B are schematic diagrams of a vehicle communication apparatus related to an embodiment of the present invention, wherein FIG. 1A shows the vehicle communication apparatus connected to a vehicle and FIG. 1B shows the vehicle communication apparatus connected to a vehicle simulator;

FIGS. 6A-6D are concept diagrams of a first operation example of the communication simulating system related to the above-described embodiment of the present invention, wherein FIG. 6A shows the operation of the vehicle communication apparatus, FIG. 6B shows the operation of the vehicle simulator, FIG. 6C shows the temporal change in a vehicle condition on a line, and FIG. 6D shows a vehicle on a line corresponding to the vehicle condition on a line;

FIGS. 7A-7D are concept diagrams of a second operation example of the communication simulating system related to the above-described embodiment of the present invention, wherein FIG. 7A shows the operation of the vehicle communication apparatus, FIG. 7B shows the operation of the vehicle simulator, FIG. 7C shows the temporal change in vehicle conditions on a line, and FIG. 7D shows a vehicle on a line corresponding to the vehicle conditions on a line;

FIG. 8 is a concept diagram showing a failure of the line checked in advance by the second operation example in FIGS. 7A-7D;

FIGS. 9A-9C are concept diagrams of a checking process, wherein FIG. 9A shows the vehicle state necessary for this checking process, FIG. 9B shows the engine state necessary for this checking process on a certain line, and FIG. 9C shows the engine state necessary for this checking process on a shortened line;

FIGS. 10A-10D are concept diagrams of a third operation example of the communication simulating system related to the above-described embodiment of the present invention, the third operation example being applied to a certain line, wherein FIG. 10A shows the operation of the vehicle communication apparatus, FIG. 10B shows the operation of the vehicle simulator, FIG. 10C shows the temporal change in a vehicle condition on a line, and FIG. 10D shows a vehicle on a line corresponding to the vehicle condition on the line;

FIGS. 11A-11D are concept diagrams of the third operation example of the communication simulating system related to the above-described embodiment of the present invention, the third operation example being applied to a different line, wherein FIG. 11A shows the operation of the vehicle communication apparatus, FIG. 11B shows the operation of the vehicle simulator, FIG. 11C shows the temporal change in a vehicle condition on a line, and FIG. 11D shows a vehicle on a line corresponding to the vehicle condition on the line;

FIGS. 13A-13C are graphs showing an example of the temporal change in the water temperature related to the first concrete example, wherein FIG. 13A shows obtained data of a vehicle model A, FIG. 13B shows obtained data of a vehicle model B, and FIG. 13C shows predicted data of a vehicle model C;

FIGS. 14A-14B are concept diagrams showing the flow of a communication process in a second concrete example of the communication simulating system related to the above-described embodiment of the present invention, wherein FIG. 14A is a sequence diagram of the communication process between the vehicle simulator and the vehicle communication apparatus, and FIG. 14B is a graph showing an example of the temporal change in a switch signal; and FIGS. 15A-15B are concept diagrams showing the flow of a communication process in a third concrete example of the communication simulating system related to the above-described embodiment of the present invention, wherein FIG. 15A is a sequence diagram of the communication process between the vehicle simulator and the vehicle communication apparatus, and FIG. 15B is a graph showing an example of the temporal change in the rotation speed.

EMBODIMENT FOR CARRYING OUT THE INVENTION

Figure 1A:
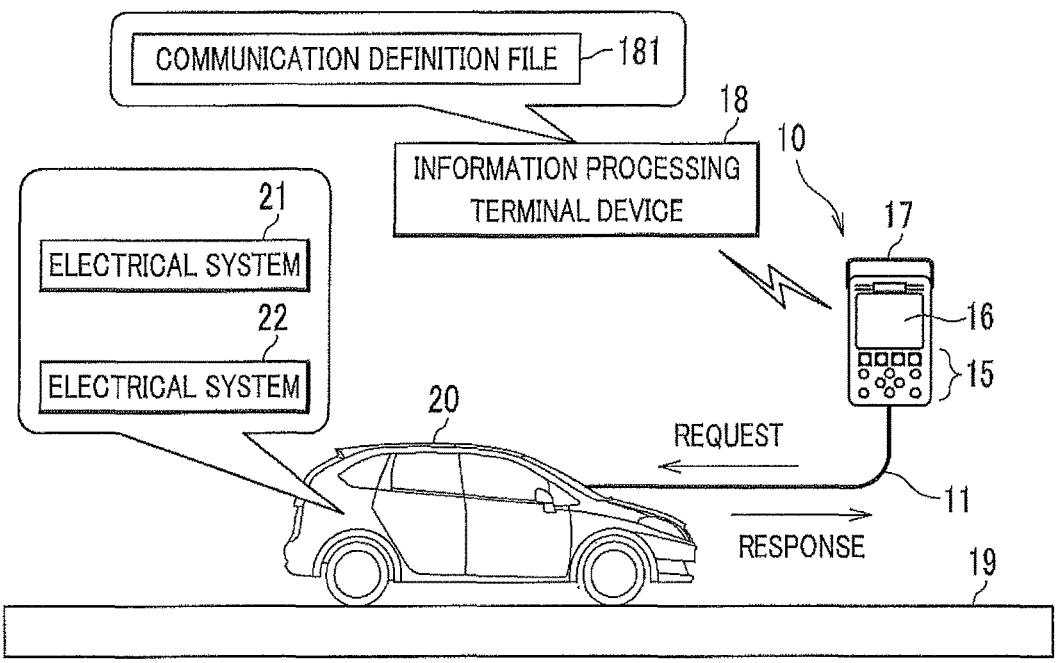

An embodiment for carrying out the present invention (hereinafter referred to as embodiment) will be described below in detail, referring to the drawings, wherein the description will be divided into chapters of 1. Overview of a vehicle communication apparatus, 2. Overview of an onboard electronic control system, 3. Overview of a communication simulating method, 4. An operation example of a communication simulating system, 5. A configuration example of the communication simulating system, 6. A concrete example of the operation of the communication simulating system, and 7. Another concrete examples of the operation of the communication simulating system.

1. Overview of the Vehicle Communication Apparatus

Figure 1B:
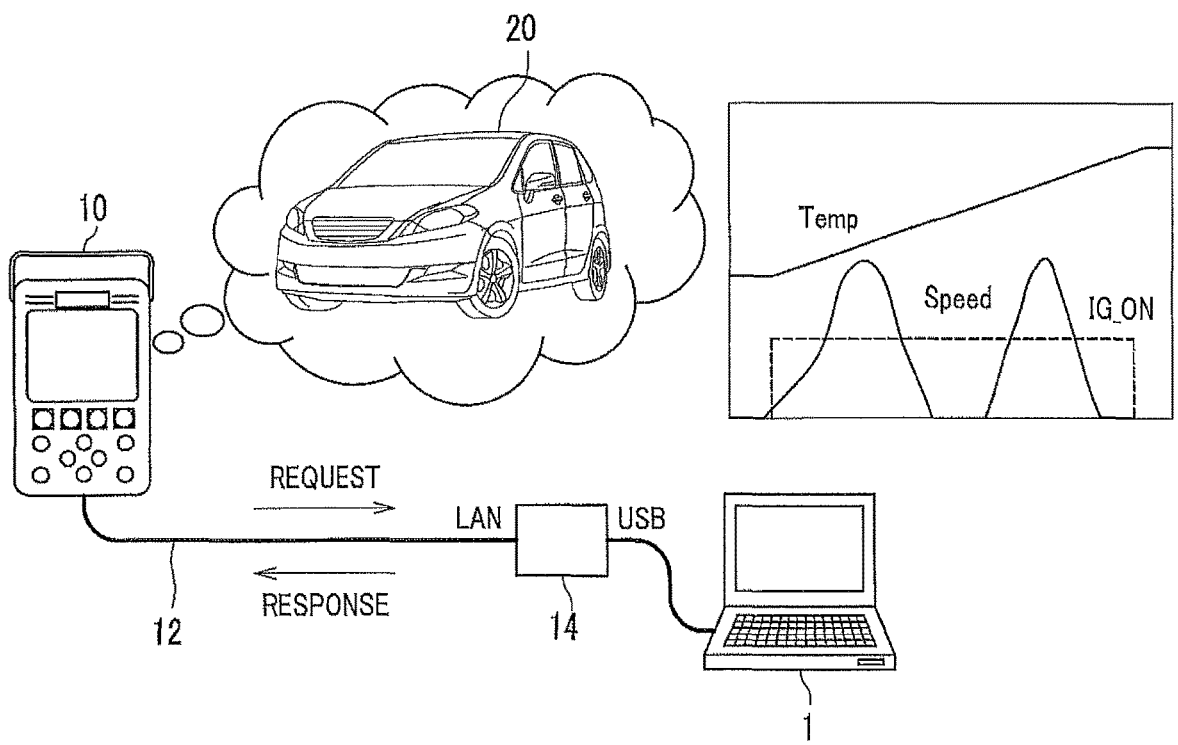

As shown in FIG. 1A and FIG. 1B, a vehicle communication apparatus 10 related to an embodiment of the present invention is provided with a key operating section 15, a display 16 and a grip section 17 for vehicle diagnosis by an internal computer, wherein the vehicle communication apparatus 10 is arranged to be hung by the grip section 17.

A vehicle communication apparatus 10 is, as shown in FIG. 1A, communicatably connected to a vehicle 20 via a vehicular interface 11 according to OBD2 (On-Board Diagnostics 2) standard. The vehicular interface 11 is provided with a connector (male) according to OBD2 standard at the tip end of a cable. The connector according to OBD2 standard of the vehicular interface 11 is attachably/detachably connected to a connector (female) according to OBD2 standard on the vehicle side.

The vehicle communication apparatus 10 is connected from outside the vehicle 20 to plural vehicle electrical systems (hereinafter referred to merely as the electrical systems) mounted on the vehicle 20 and checks the operation states of the respective electrical systems. As shown in FIG. 1A, the vehicle 20 is provided with the plural electrical systems, and communication is performed between the electrical systems and the vehicle communication apparatus 10. In the following, description will be made for brevity on the assumption that the vehicle 20 is provided with two electrical systems 21, 22. Further, in order to check the operation of the electrical systems of the vehicle, such as an automobile, although vehicle communication related to learning, writing-in, and checking is performed with the vehicle electrical systems at certain places in certain processes, vehicle communication related to checking (checking communication) will be described below in the present embodiment. Incidentally, vehicle communication for a learning work and a writing-in work is performed in component assembling of the vehicle electrical systems and the like, wherein these vehicle communications are applicable to these processes, similarly to the checking process.

As shown in FIG. 1A, the vehicle communication apparatus 10 is communicatably connected to the vehicle 20 via the vehicular interface 11 in performing a certain checking process at a certain checking place. FIG. 1A shows a case that the vehicle 20 is checked on a conveyor 19 of a line, however, there is also case that the vehicle 20 is checked after the vehicle 20 has got off the conveyor 19. As shown in FIG. 1A, the vehicle communication apparatus 10 transmits a request signal (hereinafter referred to as a request) in a checking process of a vehicle via the vehicular interface 11 to the vehicle 20, and receives a response signal (hereinafter referred to as a response) in the checking process from the vehicle 20. Thus, communication is performed between the vehicle communication apparatus 10 and the vehicle 20.

Herein, requests includes, for example, a request for reading-out vehicle information (including vehicle identification information, later-described vehicle state information, etc.), a request for writing-in various information, a request for releasing security, a request for force driving, a request for self-diagnosis, a request for a start of learning, a request for verifying a checking process, or the like. Responses include, for example, a response of vehicle information (vehicle identification information, later-described vehicle state information, etc.), a response of writing completion/non-completion, a response of security release/non-release, a response of executability/inexecutability of self-diagnosis, a response of executability/inexecutability of a start of learning, a response of implementability/non-implementability of a checking process, or the like. Incidentally, a response from an ECU of the vehicle is variable, depending on the later-described vehicle state information or the like.

Further, in this example, it is assumed that information processing terminal devices 18 attached to equipment are provided. For example, in a case of equipment provided with a checking line with checking places in a quantity of x, information processing terminal devices 18 in a quantity of x that manage information corresponding to the respective checking places are provided. These information processing terminal devices 18 include, for example, a CPU (Central Processing Unit), a ROM (Read Only Memory), a RAM (Random Access Memory), a HDD (Hard Disk Drive), an input-output interface, and the like. An information processing terminal device 18 is wirelessly and communicatably connected with the vehicle communication apparatus 10. The information processing terminal devices 18 store communication definition files 181 in a storage unit, not shown. A communication definition file 181 refers to a file that specifies a communication process performed with the vehicle communication apparatus 10 in a certain checking process. The information processing terminal devices 18 store and manage the identifications, the names, the specifications, detected values, and the like of various sensors (hereinafter referred to as equipment information) in the storage unit, as information necessary for respective checking items at the respective checking places. Further, the information processing terminal devices 18 also store and manage the speed information of a conveying device such as a belt conveyor.

As shown in FIG. 1A, the vehicle communication apparatus 10 is wirelessly and communicatably connected to the each information processing terminal device 18 attached to equipment that manages necessary information at certain checking places.

During actually performing wired communication with the vehicle 20, the vehicle communication apparatus 10 obtains equipment information related with the above-described wired communication, by wireless communication from an information processing terminal device 18.

As shown in FIG. 1B, the vehicle communication apparatus 10 is communicatably connected with a vehicle simulator 1 via a communication simulating system interface 12 and a communication simulating device 14. The communication simulating system interface 12 is connected with the communication simulating device 14 via a LAN (Local Area Network), for example, Ethernet (registered trade mark). The communication simulating system interface 12 is provided with, for example, a RJ45 connector at the tip end of a cable. The RJ45 connector, for a communication simulating system interface 12, is attachably and detachably connected to the corresponding connecter insertion opening on the communication simulating device 14 side. The communication simulating device 14 is connected to the vehicle simulator 1, for example, by a USB (Universal Serial Bus). The communication simulating device 14 is an electrical device for communicatably connecting the vehicle simulator 1, which is configured for example by an ordinary personal computer, with the vehicle communication apparatus 10. The communication simulating device 14 is connected with an external power source, not shown, to be able to operate independently from the vehicle simulator 1. The communication simulating device 14 may be arranged to have a function of a later-described logger 190 (see FIG. 5). Incidentally, the vehicular interface 11 is omitted in FIG. 1B.

Herein, for brevity, one embodiment of a communication simulating system 100 (see FIGS. 3-5) related to an embodiment of the present invention is represented by vehicle simulator 1. The vehicle simulator 1 in FIG. 1B can be configured by an ordinary computer on which a program for enabling the vehicle simulator 1 function as a communication simulating system is installed. Incidentally, details of the communication simulating system 100 will be described later.

Figure 3:
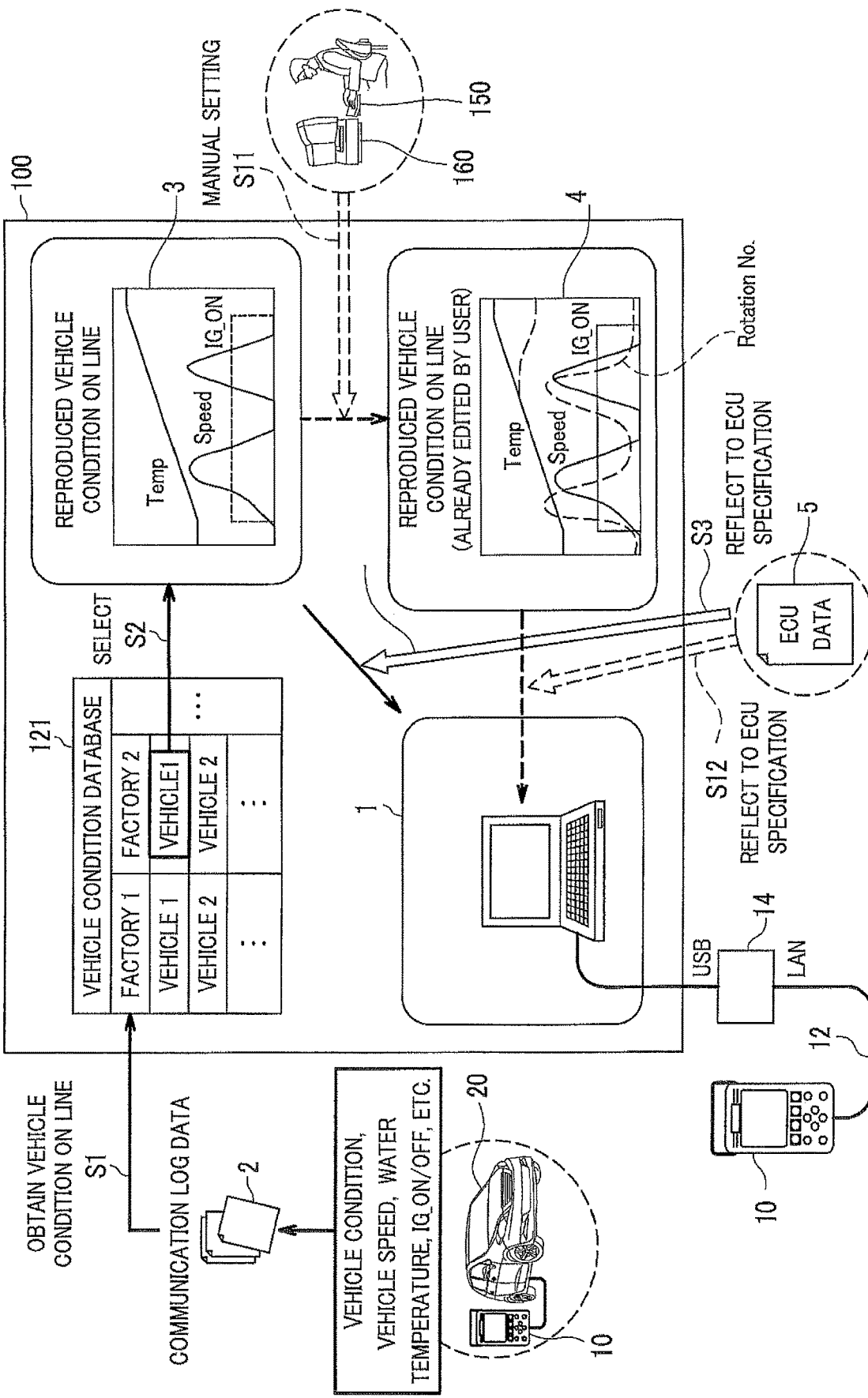
FIG. 3 is a concept diagram schematically showing the overview of a communication simulating method by a communication simulating system related to the above-described embodiment of the present invention.

In the present embodiment, for brevity, it is assumed that the vehicle simulator 1 simulates communication corresponding to specific vehicle states of a certain vehicle selected by the communication simulating system 100, as shown in FIG. 3 for example. Vehicle states in at least one kind detected at respective time points on the vehicle side on the line will be referred to as vehicle state information. An example of vehicle state information is shown by a graph in FIG. 1B with time as the horizontal axis. In this example of vehicle state represented by this graph, as shown by dashed lines, an engine starts (IG_ON) at a certain time and stops after a certain time period (IG_OFF). Herein, the vehicle speed repeats a cycle of ascending, descending, and 0 (stop) twice during a certain period of the engine operation. Further, meanwhile, the water temperature of the engine gradually rises in association with the engine operation.

FIG. 1B shows three kinds of vehicle states which momentarily change, as an example, however, this is one example. Further, vehicle state is of course different, depending on the vehicle, and may be different even with the same vehicle, depending on the equipment or the environment of the checking place. For example, vehicle state information, such as temporal change in the vehicle speed or temporal change in the water temperature, is information affected by at least one of the equipment and the environment at a checking place. Herein, the equipment of the checking place includes, for example, a line for performing a checking process. The length and the structure of the line affects, for example, the temporal change in the vehicle speed. Further, the environment of a checking place includes, for example, weather conditions such as ambient temperature. The ambient temperature affects the temporal change in the engine water temperature.

As shown in FIG. 1B, the vehicle communication apparatus 10 transmits a request in a checking process of a vehicle to the vehicle simulator 1 via the communication simulating system interface 12 and the communication simulating device 14, and receives a response in the checking process from the vehicle simulator 1. Thus, the vehicle simulator 1 simulates a communication state as if communication were performed between the vehicle communication apparatus 10 and the vehicle 20. In case that the vehicle communication apparatus 10 performs communication with the communication simulating system 100 (see FIGS. 3-5) in a checking process, it is possible, by wired communication with the communication simulating system 100, to reproduce communication as if the communication were wirelessly performed with the information processing terminal device 18 (see FIG. 1A) attached to the equipment while wired communication were in parallel performed with the vehicle 20. In this sense, the vehicle simulator 1 also functions as an equipment simulator.

2. Overview of Onboard Electronic Control System

Figure 2:
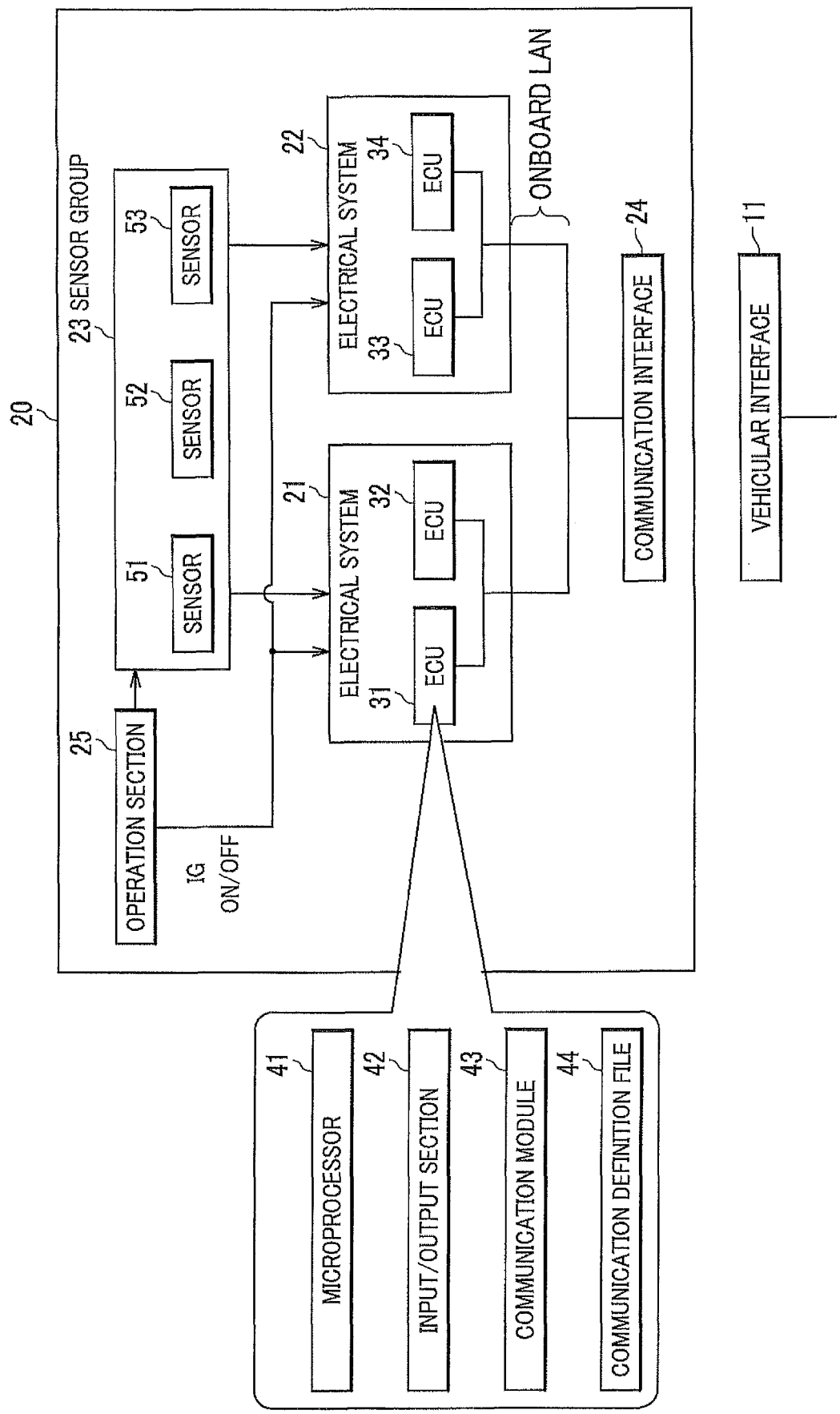
FIG. 2 is a block diagram showing a configuration example of an onboard electronic control system of the vehicle shown in FIG. 1A.

FIG. 2 shows a configuration example of an onboard electronic control system of an automobile as an object of checking. In this example, the vehicle 20 mainly includes, as shown in FIG. 2, an electrical system 21, an electrical system 22, a sensor group 23, a communication interface 24, and an operation section 25.

The electrical system 21 is provided with plural electronic control units (ECU). In the following description, for brevity, it is assumed that the electrical system 21 is provided with two ECUs 31, 32, and the electrical system 22 is provided with two ECUs 33, 34.

The ECU 31 is, for example, an electronic control system of an engine. The ECU 32 is, for example, an electronic control system of a transmission. The ECU 33 is, for example, an electronic control system of audio. The ECU 34 is, for example, an electronic control system of an air conditioner. Incidentally, more than seventy ECUs are actually mounted on the current latest automobile.

The each ECU is connected to an onboard LAN, and is arranged to be communicatable with the outside of the vehicle via the onboard LAN and the communication interface 24. The communication interface 24 is an interface according to OBD2 standard. The vehicular interface 11 of the vehicle communication apparatus 10 is attachably and detachably connected from the outside of the vehicle to the communication interface 24.

The sensor group 23 is shown representing plural sensors in a form of group for illustration. Actually, the sensors are disposed at respective positions corresponding to the respective functions thereof. In the following, for brevity, it is assumed that the sensor group 23 includes three sensors 51, 52, 53. The sensor 51 is, for example, a vehicle speed detecting sensor. The sensor 52 is, for example, a temperature sensor for detecting the water temperature of the engine. The sensor 53 is, for example, a steering angle sensor.

The operation section 25 represents plural switches and the like in a form of group for illustration, and includes, for example, a steering and an ignition switch. If a driver operates the steering wheel, the sensor 53 detects a steering angle. If the driver turns the ignition switch ON, the operation section 25 outputs ON signal of the ignition switch to the electrical systems 21, 22. Further, if the driver turns the ignition switch OFF, the operation section 25 transmits OFF signal of the ignition switch to the electrical systems 21, 22.

The electrical systems 21, 22 may have respective different communication protocols. Arrangement may be made such that the electrical system 21 corresponds, for example, to CAN communication, and the electrical system 22 corresponds, for example, to KWP 2000 communication. Incidentally, KWP 2000 conforms to ISO14230 of connectors for failure diagnosis of automobiles. CAN (Controller Area Network) conforms to OBD2 (ISO 15765). The communication protocol may be otherwise serial communication in conformity with ISO9141 or Ethernet (registered trademark).

The ECUs of the respective electrical systems are, as shown in FIG. 2, provided therein with a microprocessor 41, an input/output section 42, a communication module 43, and a communication definition file 44. Based on the communication definition file 44 and by the communication module 43, the microprocessor 41 inputs a request from the outside of the vehicle via the input/output section 42, and outputs a response to the outside of the vehicle via the input/output section 42.

Herein, communication definition files 44 are files specifying respective communication processes to be executed in certain checking processes by the plural ECUs 31-34 included in the electrical systems 21, 22.

In case that the ECU 31 is, for example, an electronic control system of the engine, the ECU 31 includes communication definition files 44 for respective communication in conformity with regulatory inspection, for example, according to Emission Standard. Incidentally, in FIG. 2, plural communication definition files are described in a group. Further, in FIG. 2, although only the elements inside the ECU 31 are shown, the ECUs 32-34 of the electrical systems 21, 22 include similar elements.

3. Overview of Communication Simulating Method

The procedure of a communication simulating method by the communication simulating system 100 will be described below, referring to FIG. 3 (and FIG. 1 and FIG. 2, as appropriate). As an assumption, the content of communication between the vehicle 20 and the vehicle communication apparatus 10 in a checking process performed at a certain checking place is recorded as communication log data 2. Further, vehicle state information and information associating a checking process, a checking place, and a vehicle with each other will be referred to as vehicle condition. Further, vehicle state information that can be uniquely identified in association with other information will also be referred to merely as vehicle condition. That is, vehicle state information such as a vehicle speed, water temperature, engine state (IG_ON/IG_OFF) or the like having been detected on the vehicle side in a certain checking process at a certain checking place for a vehicle of a certain vehicle model is a vehicle condition.

As shown in FIG. 3, it is assumed that the communication simulating system 100 stores a vehicle condition database 121. In the example of FIG. 3, the vehicle condition database 121 stores vehicle conditions individually for respective checking places and respective vehicles. Herein, checking places are factory 1, factory 2, . . . , and vehicles are vehicle 1, vehicle 2, . . . .

Further, as shown in FIG. 3, the communication simulating system 100 uses ECU data 5 in processing. The ECU data 5 represents data that is actually used in processing out of the communication definition file 44 owned by the ECUs 31-34 (see FIG. 2) of the vehicle 20. In the present embodiment, the ECU data 5 is assumed to be stored in advance inside the communication simulating system 100. Incidentally, arrangement may be made such that the ECU data 5 is input from outside at any time, as necessary, in processing.

First, the communication simulating system 100 obtains vehicle conditions on the line at a checking place (step S1). In detail, the communication simulating system 100 inputs vehicle state information as the content of communication between electrical systems and the vehicle communication apparatus in a checking process performed at a certain checking place (communication content input step). Then, the communication simulating system 100 records the inputted vehicle state information into the vehicle condition database 121 (communication recording step).

Then, the communication simulating system 100 selects vehicle conditions (step S2). Thus, the communication simulating system 100 obtains vehicle conditions (vehicle state information) from the vehicle condition database 121, corresponding to the selected vehicle conditions (vehicle state information obtaining step).

As an example, shown is a graph 3 of vehicle conditions on the line reproduced from the vehicle condition database 121 upon selection of vehicle conditions regarding the vehicle 1 at the factory 2.

Herein, selection of vehicle conditions can be realized either manually or automatically. In a case of manual selection, the user (operator) of the communication simulating system 100 executes operation of selecting desired vehicle conditions, using an input device 150 each time. In a case of automatic selection, programming is made in advance such as to sequentially select prescribed vehicle conditions, and the user inputs a command to instruct starting a process.

Then, the communication simulating system 100 reflects the vehicle conditions selected from the vehicle condition database 121 into the ECU specifications, using the ECU data 5 (step S3). That is, the communication simulating system 100 functions as a vehicle simulator 1 that performs communication with the vehicle communication apparatus 10, according to a communication process specified in the ECU data 5 and the selected vehicle conditions (checking control step).

In the above-described step S3, arrangement may be made such that the graph 3 of the reproduced vehicle conditions on the line is displayed on a display device 160, the user confirms the screen display, and thereafter the corresponding vehicle conditions are reflected into the ECU specifications.

Further, as application, the user can perform manual setting on the screen of the display device 160, such as to edit or process the vehicle conditions selected from the vehicle condition database 121 (step S11). As an example, a graph 4, which is obtained after the graph 3 of the reproduced vehicle conditions on the line is edited, is shown. The graph 4 is different from the graph 3 in that information of the number of rotations per minute of the engine is added by editing and that the processing of changing a part of the ascending curve of the water temperature is performed.

In this case, instead of the above-described step S3, the communication simulating system 100 reflects the vehicle conditions having been edited by the user into the ECU specifications, using the ECU data 5 (step S12). That is, the communication simulating system 100 functions as a vehicle simulator 1 that performs communication with the vehicle communication apparatus 10, according to a communication process specified in the ECU data 5 and the vehicle conditions having been edited by the user. Thus, it is also possible to examine whether a checking process can be implemented under conditions different from the vehicle conditions which are selected from the vehicle condition database 121 and regarding the factory 2 and the vehicle 1. It is thereby possible to evaluate effects by modification of the line or the like before the modification or the like is performed.

Still further, as application, arrangement may be made such that the user edits the ECU data 5, which is data designed on an assumption to be used by an ECU of the vehicle in actual processing, so as to reflect the ECU data obtained after the editing, into vehicle conditions having been selected or vehicle conditions having been edited. In this case, it is also possible to examine whether the checking process can be implemented with the ECU with the new specifications modified from the data of specifications having been designed for an original development purpose. In such a manner, it is possible to estimate effects in production while developing an actual vehicle.

4. Example of Operation of Communication Simulating System

In the following, an example of operating the communication simulating system 100 will be described, referring to FIG. 4 (and FIG. 1 and FIG. 3, as appropriate). As an assumption of the vehicle condition database 121 shown in FIG. 3, a concept view of the checking places (factory 1, factory 2, . . . , factory N) is schematically shown on the left side in FIG. 4. The respective factories are provided, as a production line, with a line (assembly line) for the whole of a series of assembling processes for finishing a vehicle into a completed vehicle by assembling a vehicle body, and a line (checking line) for the whole of a series of checking processes for performing regulatory inspection and the like before shipment of the completed vehicle.

The whole of a series of assembling processes performed in a factory is represented by an assembling process AF, and symbols will be omitted for a number of divided assembling processes included in this assembling process AF.

The whole of a series of checking processes performed in the factory is represented by a checking process VQ, and symbols will be omitted for a number of divided checking processes included in this checking process VQ.

The checking process VQ includes a checking process in which it is necessary that the vehicle communication apparatus 10 is connected to a vehicle, and a checking process which is performed such that the vehicle communication apparatus 10 is detached from the vehicle.

Further, the checking process VQ includes a checking process performed for a vehicle on a belt conveyor for checking merchantability (hereinafter referred to merely as a merchantability conveyor or a conveyor), and a checking process performed while the vehicle is stopped or running at a low speed, after getting off the merchantability conveyor.

The checking process VQ includes, for example, merchantability checking and regulatory checking of an engine, brakes, steering, sensors, and the like, exterior light checking of head lights and the like, checking of transmission, checking of audio, an air conditioner, and the like, checking of wheels, water proof checking, and the like. Among these, for example, in checking wheels, the engine is stopped to confirm wheel alignment by a dedicated measuring instrument called SWAT (Static Wheel Alignment Tester). Water proof checking is substantially in the last stage of the checking process VQ, and is a check performed in equipment dedicated to shower test (shower tester). Accordingly, the vehicle communication apparatus 10 is removed from the vehicle before the shower tester.

Figure 4:
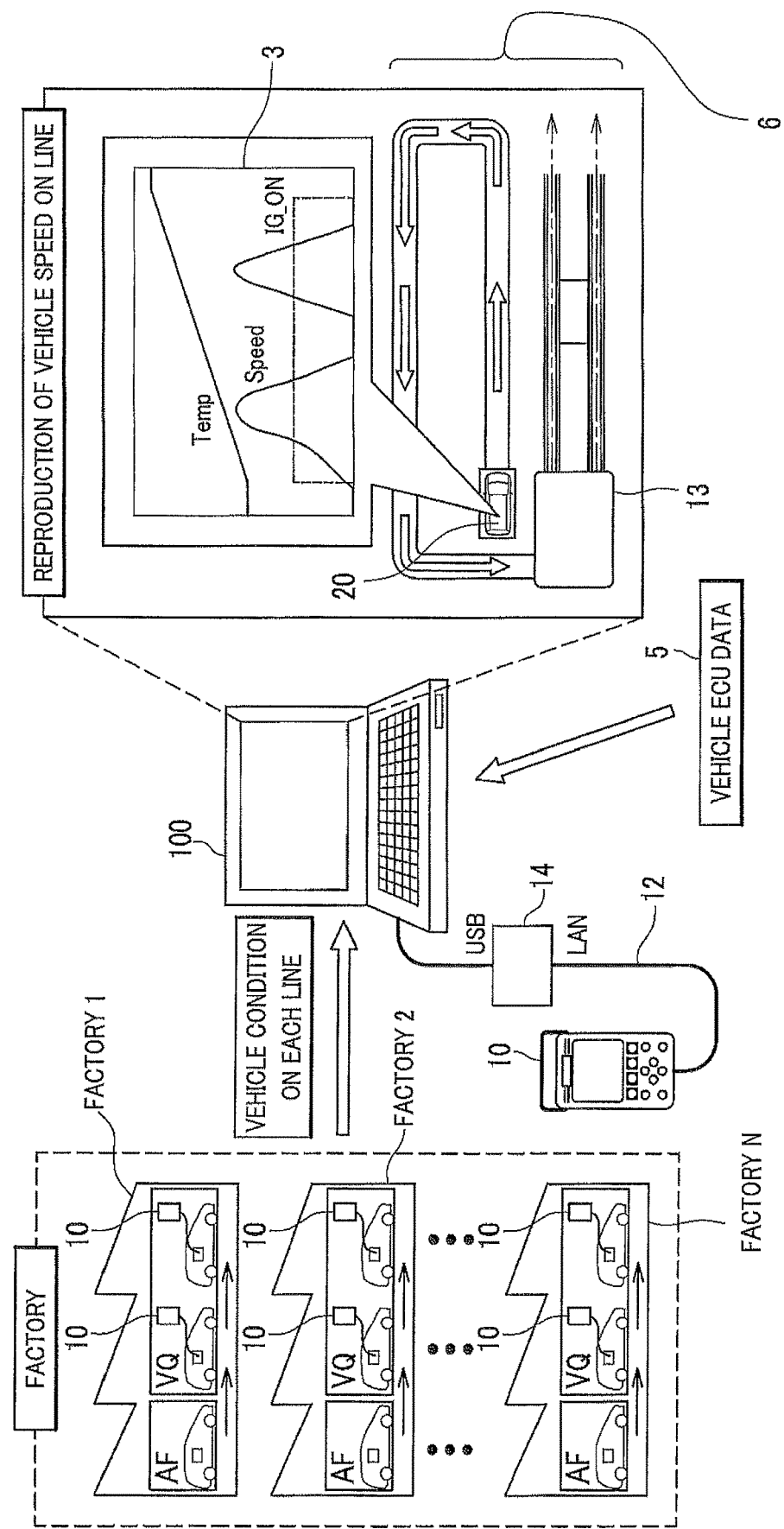
FIG. 4 is a concept diagram schematically showing an operation example of the communication simulating system related to the above-described embodiment of the present invention.

On the right side in FIG. 4, shown is a concept diagram of the line layout of a checking line, which is equipment of, for example, the factory N. The line layout 6, shown in FIG. 4, is an example of an image displayed on the display of the communication simulating system 100. On the line layout 6, checking on the merchantability conveyor and the like are performed while a vehicle 20 having entered the checking line from an assembly line, not shown, is straightly moving to the right in FIG. 4. Then, after the vehicle 20 has got off the merchantability conveyor and before the vehicle 20 makes a left turn three times, exterior light checking and checking of wheel alignment and the like are sequentially performed. Then, the vehicle 20 passes through a shower tester 13 after the third left turn.

According to the operation example, shown in FIG. 4, the communication simulating system 100 reflects the vehicle conditions on the line (graph 3 of reproduced vehicle conditions on the line), for example, in the factory 1 to the ECU specifications, using the ECU data 5 of the vehicle, as described in step S3 in FIG. 3. In such a manner, it is possible without an actual vehicle to determine whether or not a checking process similar to the checking process on the line of the factory 1 is implementable on the line, for example, of the factory N. In case that the checking process is determined to be not implementable on the line of the factory N, it is possible to perform simulation, without an actual vehicle, of changing the length of the merchantability conveyor, changing the layout itself, or changing the like, on the line layout 6. A concrete example will be described later.

5. Configuration Example of Communication Simulating System

In the following, a configuration example of a communication simulating system related to an embodiment of the present invention will be described, referring to FIG. 5 (and FIGS. 1 to 4, as appropriate). Regarding the vehicle communication apparatus 10, in FIG. 5, symbols for a vehicle communication apparatus 10a at the time of collecting the communication log data 2 (see FIG. 3) and a vehicle communication apparatus 10b at the time of performing communication with the vehicle simulator 1 (see FIG. 3) are distinguished from each other, and each corresponding one device is shown as representative. That is, the vehicle communication apparatus 10a and the vehicle communication apparatus 10b are different from each other in the timing related to the communication simulating system 100.

Similar to an ordinary computer, the communication simulating system 100 includes, for example, a CPU (Central Processing Unit), a ROM (Read Only Memory), a RAM (Random Access Memory), a HDD (Hard Disk Drive), an input-output interface, and the like. As shown in FIG. 5, the communication simulating system 100 mainly includes a communication interface 110, an input-output interface 111, a storage section 120, and a processing section 130.

The communication interface 110 functions as means for performing communication at the time when the communication simulating system 100 performs, as the vehicle simulator 1 (see FIG. 3), communication with the vehicle communication apparatus 10b. The communication interface 110 is provided with, for example, a USB interface matching the communication simulating device 14 connected with the communication simulating system interface 12 of the vehicle communication apparatus 10b.

Further, the communication interface 110 also functions as communication content input unit for input of vehicle conditions as content of communication (communication log data 2, see FIG. 3) with the vehicle electrical system and the vehicle communication apparatus 10a in the checking process performed at a certain checking place at the time of collecting the communication log data 2 (see FIG. 3). In the present embodiment, it is arranged such that vehicle conditions are input from the vehicle communication apparatus 10a through the logger 190 and via the communication interface 110. Accordingly, a logger 190 is provided with, for example, an interface matching the USB connector.

The logger 190 is connected with an external power source, not shown, to be able to operate independently from the communication simulating system 100. The logger 190 is provided with an OBD2 connector (female) to match with the OBD2 connector (male) of the vehicular interface 11 of the vehicle communication apparatus 10a. The logger 190 is connected to the vehicle communication apparatus 10a via the OBD2 connector and thus has a function to scan the communication log data 2 stored in the vehicle communication apparatus 10a, and has a function to memorize the scan data. The logger 190 is provided with a USB connector cable and is connected to the communication simulating system 100. The communication simulating system 100 obtains the scan data, as vehicle conditions, memorized in the logger 190 through the USB connector cable and via the communication interface 110.

The input-output interface 111 is an interface that inputs commands and data from the input device 150 and outputs data and the like to the display device 160. In manually setting vehicle conditions, the user (operator) uses the input device 150 (step S2, see FIG. 3). Further, in a case of manual setting in which the user edits or processes, on a screen of the display device 160, vehicle conditions selected from the vehicle condition database 121, the user uses the input device 150 (step S11, see FIG. 3). Herein, the input device 150 is configured, for example, by a mouse, a keyboard, a touch panel, a disk drive device, and the like. Further, the display device 160 is configured, for example, by a liquid crystal display or the like.

The storage section (storage unit) 120 is configured, for example, by a general hard disk or a memory. The storage section 120 stores a program for making the processing section 130 function, checking programs, various data stored in advance to be handled by the processing section 130, data to be temporarily stored, and the like. The storage section 120 stores, for example as shown, the vehicle condition database 121, a communication definition file 122, and a communication definition file 123.

The vehicle condition database 121 stores vehicle state information, checking processes, hecking places, and vehicles, which have been input, as vehicle conditions and in association with each other. This vehicle condition database 121 is a database similar to one shown in FIG. 3 as an example.

Communication definition files 122 are the communication definition files same as the respective communication definition files 44 which specify communication processes to be executed in certain checking processes by the ECUs 31, 32 included in the electrical system 21 (see FIG. 2) of the vehicle 20. Incidentally, only a representative one is shown in FIG. 5. A selected communication definition file 122 is the ECU data 5 shown in FIG. 3.

Communication definition files 123 are the communication definition files sane as the respective communication definition files 44 which specify communication processes to be executed in certain checking processes by the ECUs 33, 34 included in the electrical system 22 (see FIG. 2) of the vehicle 20. Incidentally, only a representative one is shown in FIG. 5. A selected communication definition file 123 is the ECU data 5 shown in FIG. 3.

Herein, in order to matching the current latest automobile, for example, about 700 checking programs are stored in the storage section 120. Further, the each checking program includes one checking processing unit (hereinafter referred to as a checking logic) for determining approval/rejection by the checking or includes plural checking logics. Accordingly, many communication definition files are actually stored in the storage section 120, corresponding to these checking logics. Incidentally, the vehicle condition database 121 and the respective communication definition files may be stored in the same storage unit, and may be stored, being distributed among respective different storage units.

Figure 5:
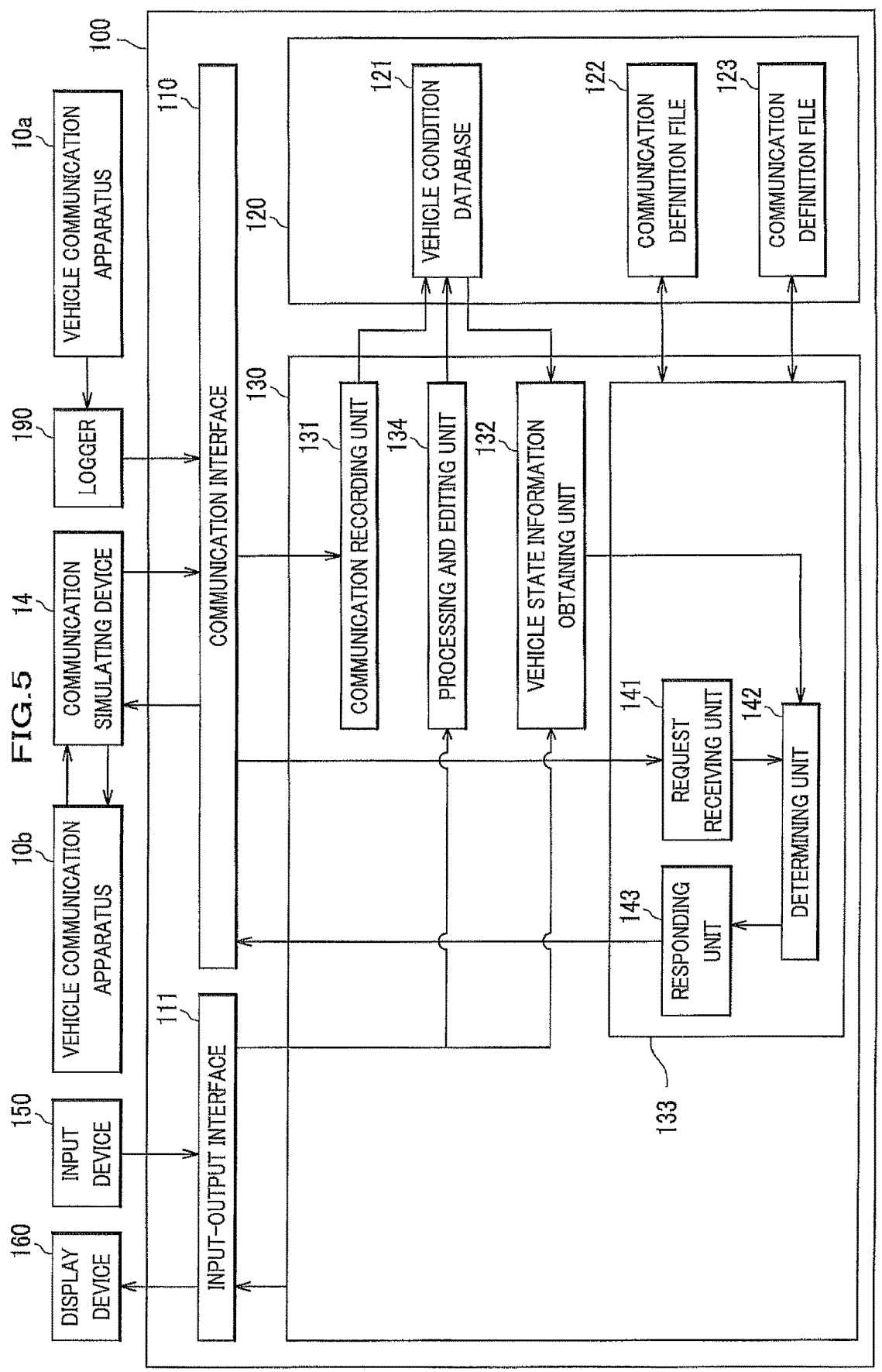
FIG. 5 is a block diagram schematically showing a configuration example of the communication simulating system related to the above-described embodiment of the present invention.

The processing section (processing unit) 130 is configured, for example, by a CPU and the like, and includes, as shown in FIG. 5, a communication recording unit 131, a vehicle state information obtaining unit 132, a communication control unit 133, and a processing and editing unit 134.

The communication recording unit 131 records the communication log data 2 (see FIG. 3) having been input from the communication interface 110 into the vehicle condition database 121 as vehicle condition (vehicle state information). The communication recording unit 131 records the inputted vehicle state information into the vehicle condition database 121, associating vehicle state information with a checking process, a checking place, and a vehicle.

The vehicle state information obtaining unit 132 obtains vehicle condition (vehicle state information) from the vehicle condition database 121, corresponding to selected vehicle condition. The vehicle condition (the vehicle state information) obtained herein is output to a communication control unit 133. Incidentally, as described above with reference to FIG. 3, selection of vehicle condition can be implemented by either manual selection or automatic selection.

The communication control unit 133 obtains a communication definition file from the storage section 120, corresponding to a selected checking process, and performs communication with the vehicle communication apparatus 10b via the communication simulating device 14, according to the communication process specified in the obtained communication definition file (ECU data 5, see FIG. 3) and vehicle condition (vehicle condition information) obtained from the vehicle condition database 121.

The communication control unit 133 is provided with, as shown in FIG. 5, a request receiving unit 141, a determining unit 142, and a responding unit 143.

The request receiving unit 141 receives a request signal (request) in a checking process of the vehicle from the vehicle communication apparatus 10b via the communication simulating system interface 12 (see FIG. 1B), the communication simulating device 14, and the communication interface 110. Herein requests include, as described above with reference to FIG. 1B, for example, a request for reading out vehicle identification information, a request for reading out vehicle state information, a request for writing-in of various information, a request for releasing security, a request for force driving, a request for self-diagnosis, a request for a start of learning, a request for verifying a checking process, or the like. A request received here is output to the determining unit 142.

The determining unit 142 determines the kind of the received request. The determining unit 142 obtains a communication definition file from the storage section 120, corresponding to the kind of a request. Herein, the obtained communication definition file is output to the responding unit 143.

If the kind of the received request is a request for self-diagnosis, a request for a start of learning, or the like, the determining unit 142 determines whether or not self-diagnosis, a start of learning, or the like is executable, according to a prescribed execution determination reference, and outputs a determination result on executability/inexecutability to the responding unit 143.

If the kind of the received request is a request for verifying a checking process, the determining unit 142 determines whether or not the checking process is implementable, according to a prescribed implementability determination reference, and outputs a determination result on implementability/non-implementability to the responding unit 143.

According to the communication definition file, the responding unit 143 generates a response signal (response) to the received request, and transmits the response signal to the vehicle communication apparatus 10b via the communication interface 110, the communication simulating device 14 and the communication simulating system interface 12 (see FIG. 1B).

If the kind of the received request is a request for self-diagnosis, a request for a start of learning, or the like, the responding unit 143 also likewise transmits a determination result on executability/inexecutability of self-diagnosis, a start of learning, or the like. If the kind of the received request is a request for verifying a checking process, the responding unit 143 also likewise transmits a determination result on implementability/non-implementability of the checking process.

The processing and editing unit 134 processes or edits vehicle conditions selected from the vehicle condition database 121, corresponding to information processing operation or editing operation from the input device 150. Herein, editing refers to newly adding data from outside to the vehicle condition database 121, sorting or deleting stored data, or the like. Processing of information refers to changing at least a part of data already stored in the vehicle condition database 121, generating new data, using at least a part of the stored data, or adding the changed or generated data as new data. An example of processing and editing is shown in the above-described step S11 (see FIG. 3).

6. Concrete Example of Operation of Communication Simulating System

The operation of the communication simulating system 100 will be described, sequentially taking three concrete examples. In these concrete examples, communication corresponding to particular vehicle condition of a certain vehicle selected by the communication simulating system 100, as shown in FIG. 5 for example, is simulated. Accordingly, the communication simulating system 100 will be described as the vehicle simulator 1, which is an embodiment thereof.

6-1. First Operation Example

A first operation example is an example of operation in a case that the kind of a request received by the vehicle simulator 1 is a request for verifying a checking process related to learning of a steering angle sensor.
(Assumption in First Example)
The vehicle simulator 1 memorizes the vehicle speed and the rotation speed of the engine of a certain vehicle on a line including a conveyor, as speed information (vehicle state information) detected in the factories 1-N shown in FIG. 4, which are checking places.

In the factory 1, performed is a checking process of a steering angle sensor in a state that the left and right wheels of the above-described vehicle are on a merchantability conveyor, however, this checking process is not performed in the factory 2. From now on, a case that execution of a checking process of a steering angle sensor is also planned in the factory 2 will be assumed.

The vehicle communication apparatus 10 inquires by a verifying request (referred to merely as a request) to the vehicle simulator 1 whether or not a checking process of learning of the steering angle sensor is implementable on the checking line of the factory 2. This request is periodically and repeatedly transmitted.

In the first operation example, a prescribed determination reference on implementability is that the vehicle speed is zero. This is because learning of the steering angle sensor cannot be started unless the vehicle is in a stop state.

FIGS. 6A-6D are concept diagrams of the first operation example, wherein FIG. 6A shows the operation of the vehicle communication apparatus, FIG. 6B shows the operation of the vehicle simulator, FIG. 6C shows the temporal change in the vehicle conditions on the checking line of the factory 2, and FIG. 6D shows the vehicle on a line corresponding to the vehicle conditions on the checking line of the factory 2.

As shown in FIG. 6D, in the factory 2, a one-side conveyor 191 is arranged as a merchantability conveyor on the line of the checking process VQ subsequent to the assembly process AF. Regarding the vehicle on the one-side conveyor 191, the wheels on one of the left and right sides are stopped on the conveyor while the wheels on the other side are on the floor to run accompanying the movement of the conveyor. The vehicle runs by itself on the floor after getting off the one-side conveyor 191.

The graph of the temporal change in the vehicle speed shown in FIG. 6C shows speed information measured in the factory 2. Concretely, as shown in FIG. 6C and FIG. 6D, on the checking line of the factory 2, at time t=t1, t2 after the vehicle gets on the merchantability conveyor, a vehicle speed (for example, 3 km) accompanying the movement of the conveyor is detected, and a rotation speed (0 rpm) showing that the engine is stopped is detected. Then, at time t=t3 after the vehicle gets off the one-side conveyor 191, a vehicle speed (0 km/hour) representing a state that the vehicle is stopped on the floor and a rotation speed (0 rpm) representing a state that the engine is stopped are detected. Further, after the vehicle starts running by itself, at time t=t4, a vehicle speed (20 km/hour) representing a low speed running on the line and a corresponding rotation speed (3000 rpm for example) of the engine are detected.

The vehicle simulator 1 performs communication with the vehicle communication apparatus 10, simulating the vehicle state of the vehicle which momentarily changes. Herein, the operation sequence between the vehicle communication apparatus 10 and the vehicle simulator 1 is as follows. First, it is assumed that, as shown in FIG. 6A, the vehicle communication apparatus 10 transmits a request 201 at time t=t1. Then, as shown in FIG. 6B, the vehicle simulator 1 reflects vehicle condition 203 on the line at time t=t1 to the ECU communication specification 202 (the communication definition file selected as the ECU data 5) and thus generates a response 204. Herein, the vehicle condition 203 is, as shown in FIG. 6C, a vehicle speed (3 km/hour for example) and a rotation speed (0 rpm). Accordingly, as shown in FIG. 6A, the vehicle communication apparatus 10 receives a negative response 205 representing non-implementability of this checking process.

The operation sequence at time t=t2 is similar to the operation sequence that was described above with symbols of numbers 200s at time t=t1 and is changed by replacing the symbols by symbols of numbers 210s. In this case, the vehicle communication apparatus 10 receives a negative response 215 similarly to the case at time t=t1.

The operation sequence at time t=t4 is similar to the operation sequence that has been described above with symbols of numbers 200s at time t=t1 and is changed by replacing the symbols by symbols of numbers 230s. In this case, similarly to the case of time t=t1, the vehicle communication apparatus 10 receives a negative response 235.

The operation sequence at time t=t3 is similar to the operation sequence that was described above with symbols of numbers 200s at time t=t1 and is changed by replacing the symbols by symbols of numbers 220s. However, a response 225 received by the vehicle communication apparatus 10 is a positive response representing the implementability of the checking process. This is because, as shown in FIG. 6C, the vehicle speed (0 km/hour) and the rotation speed (0 rpm) satisfy the implementability determination reference.

Accordingly, based on a prescribed implementability determination reference, the vehicle simulator 1 verifies that the checking process of learning of the steering angle sensor is implementable on the checking line of the factory 2, on the assumption that the position, where the checking process is performed, is the position at time t=t3, in other words, the position where the vehicle has got off the one-side conveyor 191 and is in a stop state on the floor. Accordingly, this verification result can be reflected to a plan of performing the checking process of the steering angle sensor in the factory 2.

Herein, for comparison, it will be assumed that verification of a detailed process on the line has been performed in the factory 2, using an actual vehicle without using the vehicle simulator 1. For example, in the factory 2, performing the checking process of the steering angle sensor on the merchantability conveyor is tried similarly to the case in the factory 1. Then, as the merchantability conveyor is a one-side conveyor in the factory 2, the vehicle speed does not become 0 on the conveyor, which proves that the checking process of the steering angle sensor is not implementable. Consequently, a modification or verification of a process layout becomes necessary to increase the man-hours.

On the other hand, in case of using the vehicle simulator 1 as in the present embodiment, occurrence of such an event can be prevented in advance. Further, by the vehicle simulator 1, for example, in a case of installing a new line, even when a merchantability conveyor is formed by a one-side conveyor, it is possible to realize a low manufacturing cost while maintaining a high quality, for example, by only changing the position of the checking process of the steering angle sensor to a position where the checking process can be performed. Further, the vehicle simulator 1 in the present embodiment enables similar advantages even at a checking place with a different line formation, in addition to a factory where a merchantability conveyor is a one-side conveyor.

6-2. Second Operation Example

The second operation example is an example of operation in a case that the kind of a request received by the vehicle simulator 1 is a request for verifying a checking process related to emission regulation (idle check of an engine).
(Assumption in Second Operation Example)

The difference from the assumption of the above-described first operation example is as follows.

As vehicle state information detected by the factories 1-N on a certain vehicle, the vehicle simulator 1 memorizes the vehicle speed, the rotation speed of the engine, and in addition, the water temperature of the engine on a line including a conveyor.

In the factory 1, performed is a checking process of idle check of the engine of the above-described vehicle on a merchantability conveyor, however, this checking process is not performed in the factory 3. From now on, a case that execution of a checking process of idle check of an engine is also planned in the factory 3 will be assumed.

The length of the checking line of the factory 3 and the length of the checking line of the factory 1 are equal. The factory 3 is located at a site in a cold region where the ambient temperature is extremely lower compared with the case of the factory 1.

The vehicle communication apparatus 10 inquires by a request whether or not a checking process of idle check of an engine is implementable on the checking line of the factory 3.

A prescribed determination reference on implementability is satisfying conditions that the vehicle speed is zero and the water temperature is higher than or equal to 50° C. during idling of the engine. This is because these conditions enable a start of checking.

FIGS. 7A-7D are concept diagrams of the second operation example, wherein FIG. 7A shows the operation of the vehicle communication apparatus, FIG. 7B shows the operation of the vehicle simulator, FIG. 7C shows the temporal change in the vehicle conditions on the checking line of the factory 3, and FIG. 7D shows a vehicle on a line corresponding to the vehicle conditions on the checking line of the factory 3.

As shown in FIG. 7D, in the factory 3, all of the left and right wheels of the vehicle get on a merchantability conveyor 192 on the line of a checking process VQ subsequent to the assembly process AF. After the vehicle gets off the merchantability conveyor 192, the vehicle runs by itself on the floor and stops at a certain position.

The graph shown in FIG. 7C represents an example of vehicle condition information measured in the factory 3. The dashed curve of the graph represents the vehicle speed, and the solid curve represents the water temperature. Concretely, as shown in FIG. 7C and FIG. 7D, on the checking line of the factory 3, in a period when the vehicle is on the merchantability conveyor 192 (time t=t1, t2, t3), the vehicle speed (0 km/hour) during idling of the engine is detected; the maximum vehicle speed is detected when the vehicle runs by itself on the floor after the vehicle gets off the merchantability conveyor 192; and the vehicle speed (0 km/hour) during idling of the engine is detected when the vehicle stops at a certain position (time t=t4). Further, the rotation speeds of the engine at the respective time t=t1, t2, t3, t4 are detected, for example, to be 812, 723, 706, and 704 rpm.

As shown in FIG. 7C, on the line of the checking process in the factory 3, the water temperatures of the engine at time t=t1, t2, t3, t4 are detected respectively to be 20, 30, 40, 50° C.

The vehicle simulator 1 performs communication with the vehicle communication apparatus 10, simulating the vehicle state of the vehicle which momentarily changes. Herein, the operation sequence between the vehicle communication apparatus 10 and the vehicle simulator 1 is as follows. First, it is assumed that, as shown in FIG. 7A, the vehicle communication apparatus 10 has transmitted a request 301 at time t=t1. Then, as shown in FIG. 7B, the vehicle simulator 1 reflects vehicle condition 303 on the line at time t=t1 to the ECU communication specification 302 (the communication definition file selected as the ECU data 5) and thus generates a response 304. Herein, the vehicle condition 303 is, as shown in FIG. 7C, a vehicle speed (0 km/hour, a rotation speed (812 rpm), and a water temperature (20° C.). Accordingly, as shown in FIG. 7A, the vehicle communication apparatus 10 receives a negative response 305 representing unsatisfaction of checking conditions.

The operation sequence at time t=t2 is similar to the operation sequence that was described above with symbols of numbers 300s at time t=t1 and is changed by replacing the symbols by symbols of numbers 310s. In this case, the vehicle communication apparatus 10 receives a negative response 315 similarly to the case at time t=t1.

The operation sequence at time t=t3 is similar to the operation sequence that was described above with symbols of numbers 300s at time t=t1 and is changed by replacing the symbols by symbols of numbers 320s. In this case, similarly to the case of time t=t1, the vehicle communication apparatus 10 receives a negative response 325.

Herein, for comparison, it will be assumed that verification of a detailed process on the line has been performed in the factory 3 located in a cold region, using an actual vehicle without using the vehicle simulator 1. For example, in the factory 3, performing the checking process of idle check of the engine on the merchantability conveyor is tried similarly to the case in the factory 1. Then, on the line of the checking process in the factory 3, as shown in FIG. 8, the water temperature is low at a start of the engine of the vehicle 20 (341) and the rise in the water temperature on the merchantability conveyor 192 is small (342) so that it takes a time for the water temperature to reach a temperature enabling a start of checking, resulting in running out of time for checking (343). That is, the vehicle 20 reaches the end point of the merchantability conveyor 192 before emission measurement is completed.

On the other hand, according to the present embodiment, as shown in FIGS. 7A-7D, the vehicle communication apparatus 10 receives a negative response from the vehicle simulator 1 at time t=t1, t2, t3. Accordingly, even without using an actual vehicle, it is possible to predict in advance that the checking process of idle check of the engine performed on the merchantability conveyor in the factory 1 is not implementable on the merchantability conveyor in the factory 3.

In case of trying to perform the checking procedure of idle check of the engine on the merchantability conveyor similarly to the checking process having been performed in the factory 1, it would be necessary to increase, for example, the room temperature at the checking line. Accordingly, if the procedure were limited to the procedure performed in the factory 1, rising of the manufacturing cost due to air heating would be brought about in the factory 3.

On the other hand, according to the present embodiment, as shown in FIG. 7C, if the operation sequence described above with symbols of numbers 300s at time t=t1 is changed by replacing the symbols by symbols of numbers 320s at time t=t4, the vehicle communication apparatus 10 receives a response 335 similarly to the case of time t=t1, however, the response 335 at this time is a positive response representing satisfaction of checking conditions. This is because of, as shown in FIG. 7C, the vehicle speed (0 km/hour), the rotation speed (704 rpm), and the water temperature (50° C.), which satisfy the implementability determination reference.

Accordingly, by the vehicle simulator 1, based on prescribed applicability determination reference, a checking process of emission regulation (idle check of an engine) is not implementable on the merchantability conveyor 192 on the checking line of the factory 3, however, it is possible to verify implementability of the checking process at a certain position after the vehicle has got off the merchantability conveyor 192. Thus, in the factory 3 located in a cold region, if only the sequential order of performing a checking process and the checking position are changed, it is possible to recognize in advance that vehicles can be produced with a low cost even in a cold region, by simulation without an actual vehicle.

6-3. Third Operation Example

The third operation example is an example of operation in a case that the kind of a request received by the vehicle simulator 1 is a request for verifying a checking process related to emission regulation (misfire checking) of an engine.

(Assumption in Third Operation Example)

The difference from the assumption in the first operation example is as follows.

As vehicle state information detected by the factories 1-N on a certain vehicle, the vehicle simulator 1 memorizes the operation period and the stop period of the engine on a line including a conveyor.

In the factory 1, performed is a checking process of misfire check (hereinafter, referred to as MF checking), related to misfire of the engine of the above-described vehicle, however, this checking process is not performed in the factory 4. From now on, a case that execution of a checking process of MF checking is also planned in the factory 4 will be assumed.

The length of the production line (assembly line+checking line) of the factory 4 and the length of the production line (assembly line+checking line) of the factory 1 are equal. However, in the equipment of the factory 4, the assembly line is extended while the checking line is shortened, compared with the factory 1. That is, the length of the checking line of the factory 4 is shorter than the length of the checking line of the factory 1.

The vehicle communication apparatus 10 inquires by a request whether or not a checking process of MF checking is implementable on the checking line of the factory 4.

Prescribed implementability determination reference is achievement of self-diagnosis about completion of air bleeding from the fuel line. Herein, it is assumed that, if a predetermined time has elapsed from a start of the engine, it will be taken that air bleeding from the fuel line is complete, and self-diagnosis is thus achieved and completed. The time of self-diagnosis having elapsed until then is reset. That is, when the engine has stopped before the predetermined time has elapsed from a start of the engine, even if the engine restarts, the time having elapsed for the self-diagnosis before the stoppage of the engine becomes invalid, and it is necessary to perform the self-diagnosis again from the beginning.

FIG. 9A shows a concept diagram in which a vehicle state necessary for the vehicle 20 in performing MF checking is associated with elapse time on the checking line. As shown in FIG. 9A, corresponding to the elapse time on the checking line, the vehicle state changes in the order of an idle state 401, a low speed state 402, an idle state 403, a low speed state 404, an engine stop state 405, a low speed state 406, an idle state 407, a low speed state 408, and an idle state 409.

FIG. 9B shows a concept diagram in which an engine state necessary for this checking process in performing MF checking on the checking line of the factory 1 is associated with an elapse time on the checking line. As shown in FIG. 9B, corresponding to the elapse time on the checking line of the factory 1, the engine state of the vehicle 20 changes in the order of an engine start state 411, an engine stop state 412, and an engine start state 413.

Herein, the temporal axis in FIG. 9B corresponds to the temporal axis in FIG. 9A. That is, the period of the engine start state 411 shown in FIG. 9B agrees with the period of the idle state 401, the low speed state 402, the idle state 403, and the low speed state 404 shown in FIG. 9A. The period of the engine stop state 412 shown in FIG. 9B agrees with the engine stop state 405 shown in FIG. 9A. The period of the engine start state 413, shown in FIG. 9B, agrees with the period of the low speed state 406, the idle state 407, the low speed state 408, and the idle state 409 shown in FIG. 9A. As shown in FIG. 9B, MF checking starts simultaneously with the start of the period of the engine start state 411 on the checking line of the factory 1. The MF checking is completed after a certain checking time T1 has elapsed in the period of the engine start state 411.

Further, FIG. 9C shows a concept diagram in which the engine state, which is assumed in performing MF checking on the checking line of the factory 4 and is necessary for this checking process, is associated with the elapsed time on the checking line. As shown in FIG. 9C, corresponding to the elapsed time on the line of the factory 4, the engine state of the vehicle 20 changes in the order of an engine stop state 421 in the last stage of the assembly line of the factory 4, an engine start state 422 after entering the checking line of the factory 4, an engine stop state 423, and an engine start state 424.

Herein, the temporal axis in FIG. 9C corresponds to the temporal axis in FIG. 9A. That is, the period of the engine stop state 421 shown in FIG. 9C agrees with the period of the idle state 401 shown in FIG. 9A. The period of the engine start state 422 shown in FIG. 9C agrees with the period of the low speed state 402, the idle state 403, and the low speed state 404 shown in FIG. 9A. Planning in such a manner is aimed at reflecting the fact that the assembly line of the factory 4 is longer than the assembly line of the vehicle simulator 1, and the checking line of the factory 4 is correspondingly shorter than the checking line of the factory 1. The period of the engine stop state 423 and the period of the running state 424 shown in FIG. 9C agree respectively with the period of the engine stop state 412 and the period of the engine start state 413 shown in FIG. 9B. As shown in FIG. 9C, on the checking line of the factory 4, the MF checking is arranged to start simultaneously with the start of the period of the engine start state 422. Then, the MF checking is completed after an assumed checking time T2 with the same temporal width as the checking time T1 has elapsed, and it is thus planned to make the MF checking implementable.

In the following, for comparison, it will be described about the fact that it is possible to simulate the implementability of MF checking by the vehicle simulator 1, using the vehicle information on the checking line of the factory 1 where MF checking has been already performed.

FIGS. 10A-10D are concept diagrams of the third operation example of the line of the factory 1, wherein FIG. 10A shows the operation of the vehicle communication apparatus, FIG. 10B shows the operation of the vehicle simulator, FIG. 10C shows the temporal change in the vehicle conditions on the checking line of the factory 1, and FIG. 10D shows a vehicle on a line corresponding to the vehicle conditions on the checking line of the factory 1.

In the factory 1, on the line of the checking process VQ subsequent to the assembly process AF, all of the left and right wheels of a vehicle get on a conveyor 193 shown in FIG. 10D. The vehicle moves on the floor after getting off the conveyor 193; the engine is stopped at a position where the SWAT is installed to confirm the wheel alignment; the vehicle thereafter runs by itself to complete the MF checking; and then the vehicle proceeds to the next checking process on the checking line.

The graph shown in FIG. 10C shows an example of vehicle information observed in the factory 1. The horizontal axis of this graph represents time, and the vertical axis represents binary evaluation corresponding to prescribed implementability determination reference. In more detail, the vertical axis of this graph represents determination values in two steps of OK and NG on the air-bleeding condition determination on the lower side of the vertical axis, and determination values in two steps of ON (engine start) and OFF (engine stop) on the engine operation (ENG_RUN) on the upper side of the vertical axis.

Concretely, as shown in FIG. 10C and FIG. 10D, on the checking line of the factory 1, the vehicle gets on the conveyor 193 at time t=t1. The engine operation (ENG_RUN) then is OFF and the air-bleeding condition determination is NG. At time t=t2 when the engine starts, the engine operation (ENG_RUN) turns into ON so that self-diagnosis starts. At time t=t3 when a prescribed time (self-diagnosis time T3) has elapsed after the start of the engine, the air-bleeding condition determination turns into OK, and the self-diagnosis is achieved and completed. After the vehicle gets off the conveyor 193, the vehicle moves on the floor; the engine is stopped at time t=t5 at the position where the SWAT is installed; and then the engine operation (ENG_RUN) turns into OFF. The vehicle confirms wheel alignment, the engine starts at time t=t6, and then the engine operation (ENG_RUN) turns into ON.

The vehicle simulator 1 performs communication with the vehicle communication apparatus 10, simulating the vehicle state of this vehicle, the vehicle state momentarily changing. Herein, the operation sequence between the vehicle communication apparatus 10 and the vehicle simulator 1 is as follows. After the air-bleeding condition determination turns into OK at time t=t3, the vehicle communication apparatus 10 is assumed to transmit a request 501, as shown in FIG. 10A, at time t=t4 before the vehicle gets off the conveyor 193. Then, as shown in FIG. 10B, the vehicle simulator 1 generates a response 504, reflecting the vehicle condition 503 at time t=t4 to ECU communication specification 502 (a communication definition file selected as the ECU data 5). Herein, the vehicle condition 503 is, as shown in FIG. 10C, the duration of the engine operation (ENG_RUN). The duration of the engine operation (ENG_RUN) is, as shown in FIG. 10C, the time period t2-t4, and is longer than or equal to the self-diagnosis time T3 of air-bleeding. Accordingly, as shown in FIG. 10A, the vehicle communication apparatus 10 receives a positive response 505 representing satisfaction of the checking condition.

In the following, described will be a case where simulation is performed as to whether the checking process of MF checking is implementable, by the vehicle simulator 1, using vehicle information on the checking line of the factory 4. Incidentally, an operation sequence and the like similar to the description of the above-described simulation on the checking line of the factory 1 will be omitted, as appropriate, and different points will be described.

FIGS. 11A-11D are concept diagrams similar to FIGS. 10A-10D regarding the third operation example on the line of the factory 4, however, the time described in FIGS. 11A-11D and the time described in FIGS. 10A-10D disagree with each other.

Figures 11A, 11B, 11C, 11D:
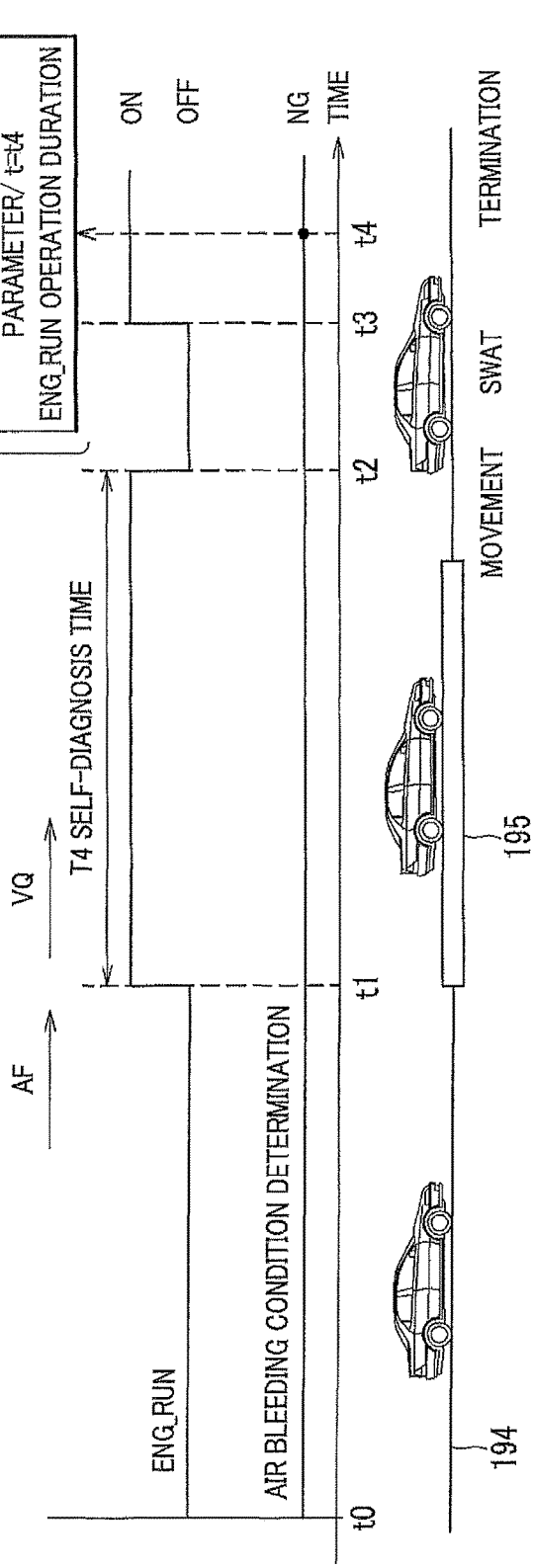

On the line of the checking process VQ subsequent to the assembly process AF in the factory 4, all of the left and right wheels of the vehicle get on a conveyor 195, shown in FIG. 11D. The length of the conveyor 195 is shorter than the length of the conveyor 193 shown in FIG. 10D. Herein, the total of the length of the conveyor 195 and the length of the extended assembly line 194 shown in FIG. 11D is set equal to the length of the conveyor 193 shown in FIG. 10D.

The graph shown in FIG. 11C represents an example of vehicle information observed in the factory 4.

Concretely, as shown in FIG. 11C and FIG. 11D, the vehicle is on the extended assembly line at t=t0 in the factory 4. Herein, the engine operation (ENG_RUN) is OFF and the air-bleeding condition determination is NG. The vehicle gets on the conveyor 195 on the checking line at time t=t1 in the factory 4. When the engine starts then, the engine operation (ENG_RUN) turns into ON, and self-diagnosis starts. During when performing the self-diagnosis after the start of engine, the vehicle gets off the conveyor 193, and moves on the floor. Then, at time t=t2, when the engine is stopped at the position where the SWAT is installed, the engine operation (ENG_RUN) turns into OFF. Herein, the air-bleeding condition determination still remains NG. The time period t1-t2 (self-diagnosis time T4) is shorter than the air-bleeding self-diagnosis time period T3 shown in FIG. 10C. That is, at the time point t=t2 when the engine stops, the self-diagnosis has not been achieved and is terminated. Then, the self-diagnosis time having elapsed until then is reset. The vehicle confirms wheel alignment, and when the engine starts at time t=t3, the engine operation (ENG_RUN) turns into ON, and the self-diagnosis is restarted from the beginning.

The vehicle simulator 1 performs communication with the vehicle communication apparatus 10, simulating the vehicle state, of this vehicle, momentarily changing. Herein, the operation between the vehicle communication apparatus 10 and the vehicle simulator 1 is shown in FIG. 11A and FIG. 11B. The operation sequence then is similar to the operation sequence that was described above with symbols of numbers 500s in FIGS. 10A-10D and is changed by replacing the symbols by symbols of numbers 510s. However, a response 515 received by the vehicle communication apparatus 10 shown in FIG. 11A is a negative response representing unsatisfaction of checking condition. This is because the duration of the engine operation (ENG_RUN) as the vehicle condition 513 is, as shown in FIG. 11C, the time period t3-t4, and is shorter than the air-bleeding self-diagnosis time T3 shown in FIG. 10C, unsatisfying the implementability determination reference.

Accordingly, by the vehicle simulator 1, it is possible to verify that the checking process of emission regulation (MF checking) of the engine is implementable on the checking line of the factory 1 and is not implementable on the checking line of the factory 4, based on prescribed implementability determination reference. Accordingly, a verification result of a checking process, the verification result being obtained in advance by simulation without an actual vehicle, can be reflected to a future development plan.

7. Other Concrete Examples of Communication Simulating System

In the following, the function of the communication control unit 133 of the communication simulating system 100 will be described. The function of the communication control unit 133 is characterized in performing a communication process with the vehicle communication apparatus 10 on selected vehicle conditions, using virtual vehicle state information of at least one kind generated through reflecting an assumed amount of change to at least one kind of vehicle state information.

In the following, three concrete examples of virtual vehicle state information generated through reflecting an amount of change will be sequentially described. Incidentally, in these concrete examples, for example, communication corresponding to a specific vehicle state of a certain vehicle selected by the communication simulating system 100 shown in FIG. 5 is simulated, and accordingly, the communication simulating system 100 will be described as the vehicle simulator 1, which is an embodiment thereof.

7-1. First Concrete Example

A first concrete example is a concrete example on virtual vehicle state information generated through reflecting an amount of change in a case of assuming that the vehicle simulator 1 simulates a vehicle model changed from a base vehicle model.

In the following, a command, which requires certain vehicle state information in certain checking from a base vehicle model and a similar vehicle model, will be referred to as command A.

Herein, a base vehicle model is, for example, a vehicle model which is already in mass-production. The similar vehicle model is, for example, a vehicle model derivative from the base vehicle model and is a vehicle model with a minor-change from the base vehicle model. This similar vehicle model is similar to the base vehicle model, for example, in the vehicle body or the frame.

For example, it will be assumed that a vehicle model A as a base vehicle model and a vehicle model B as a similar vehicle model similar to the vehicle model A have performed certain checking and generated respective responses to a command A. Described will be an amount of change, in vehicle state information, assumed in a case of performing the above-described checking on a vehicle model C, which is a similar vehicle model based on the vehicle model A, in a situation that this checking has not been performed on the vehicle model C.

In such a case, from comparison between vehicle state information obtained previously on the vehicle model B, which is a similar vehicle model similar to the vehicle model A, and vehicle state information obtained previously on the vehicle model A, a certain numerical transformation rule is prepared in advance. The numerical transformation rule is, for example, a rule of setting vehicle state information of the vehicle model B by multiplying the numerical value of the vehicle state information of the vehicle model A by a certain factor for the vehicle model B. Likewise, if a factor for the vehicle model C is decided, it is possible to transform the vehicle state information of the vehicle model A into the vehicle state information of the vehicle model C. Accordingly, the vehicle state information of the vehicle model C can be set by multiplying vehicle state information of the vehicle model A, the information having been obtained previously, by this factor for the vehicle model C.

The factor for the vehicle model C can be empirically decided by a person, referring to a certain factor for the vehicle model B. A certain factor for the vehicle model B can be empirically decided by a person. Incidentally, arrangement may be made such that the communication simulating system 100 automatically obtains a numerical transformation rule or a certain factor for the vehicle model B, by comparison between stored data of the vehicle model A and stored data of the vehicle model B.

Figure 12:
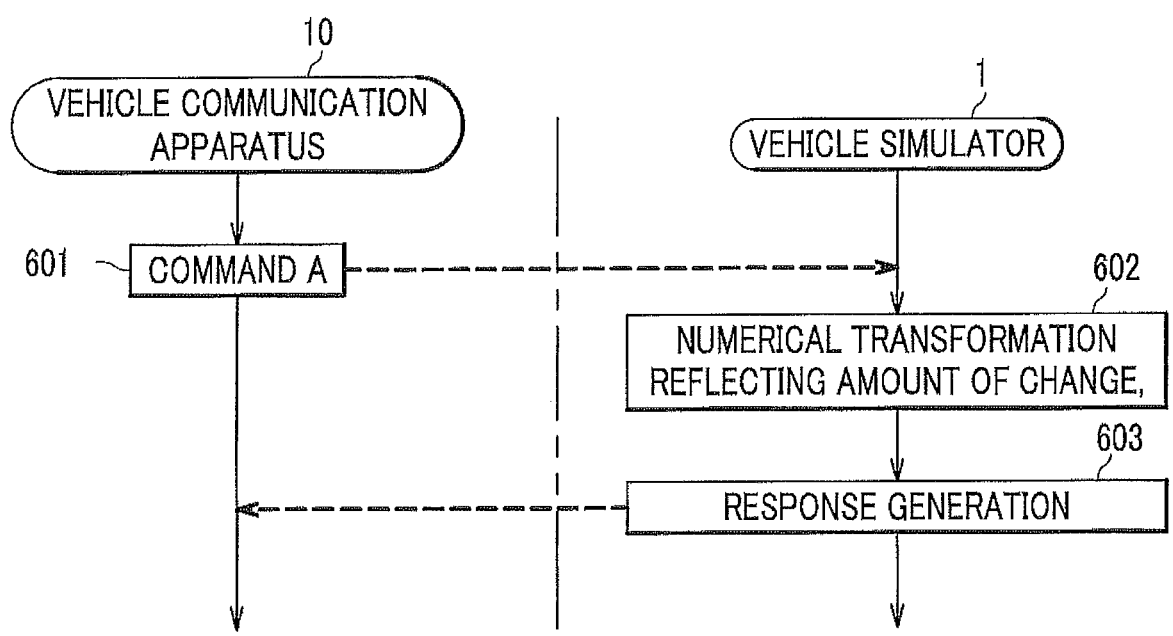
FIG. 12 is a sequence diagram showing the flow of a communication process in a first concrete example of the communication simulating system related to the above-described embodiment of the present invention.

The flow of a communication process will be described, with reference to FIG. 12, on a case that the vehicle state information is, for example, the water temperature of the engine. As shown in FIG. 12, the vehicle communication apparatus 10 transmits a command A to the vehicle simulator 1 at a certain time (601), and the vehicle simulator 1 receives the command A.

In a case that the vehicle simulator 1 having received the command A simulates the vehicle model A or the vehicle model B, the process with symbol 602 is skipped, and a response to the command A is generated by extracting a water temperature (vehicle state information) detected previously.

On the other hand, in a case that the vehicle simulator 1 having received the command A simulates the vehicle model C, vehicle state information has not been obtained previously. Accordingly, numerically transformed virtual vehicle state information is generated by reflecting an amount of change to the water temperature (vehicle state information) of the vehicle model A as the base of the vehicle model C, the water temperature having been obtained previously (602). The vehicle simulator 1 generates a response to the command A, using this virtual vehicle state information (603).

In the following, a concrete example of a case that the vehicle state information is, for example, the water temperature will be described, referring to FIG. 13A, FIG. 13B, and FIG. 13C.

Figure 13A:
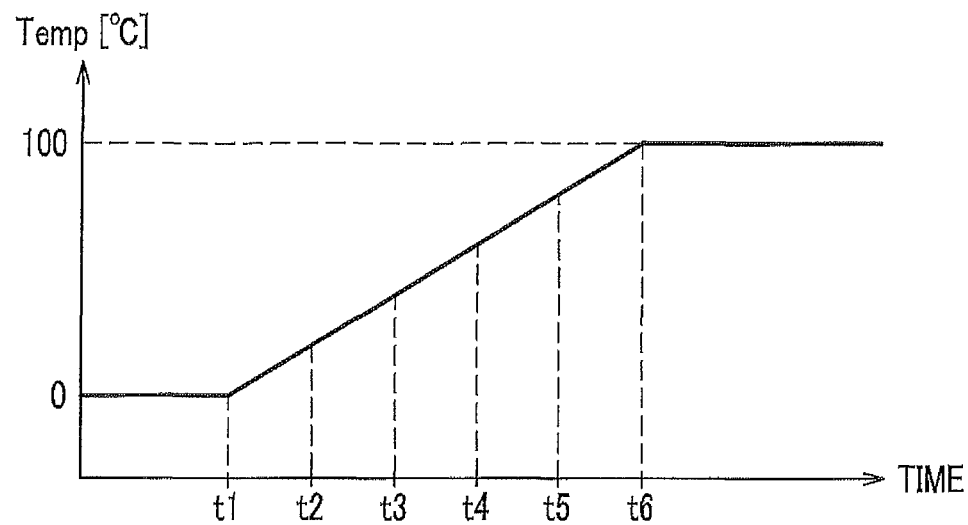

FIG. 13A is a graph representing an example of temporal change in the water temperature, of the vehicle model A, obtained previously. Herein, the vehicle model A performed checking communication six times at time t1-t6 with the vehicle communication apparatus 10 in a certain checking process, The temporal change in the water temperature of the vehicle model A is linear, and the temporal change rate is assumed to be 20, for example.

Figure 13B:
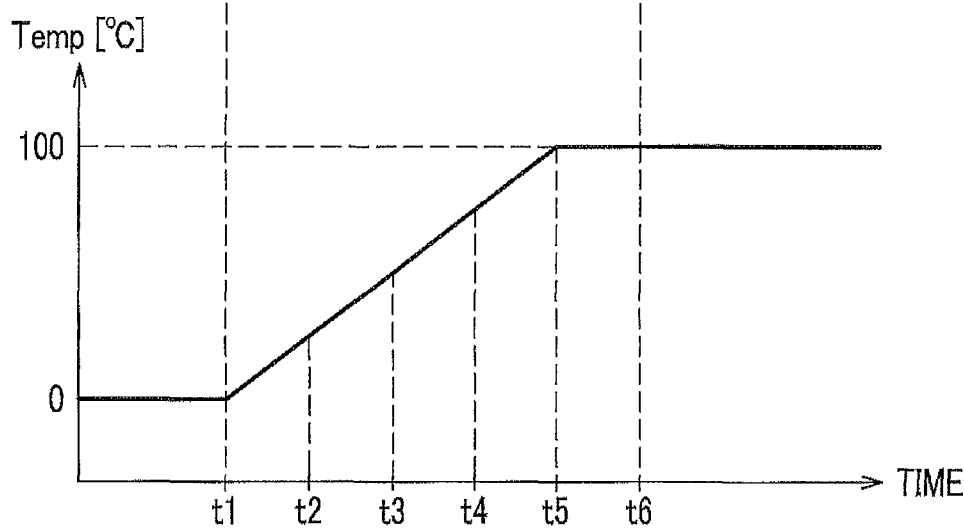

FIG. 13B is a graph representing an example of temporal change in the water temperature obtained previously of the vehicle model B similar to the vehicle model A. Herein, the vehicle model B also performed checking communication six times likewise. The temporal change in the water temperature of the vehicle model B is linear, and the temporal change rate is assumed to be 25, for example.

From the two graphs shown in FIG. 13A and FIG. 13B, it is recognized that the time required for the water temperature of the vehicle model B to become 100° C. decreases by 20%, compared with the case of the vehicle model A, and the water temperature of the vehicle model B increases by 25% during the period of time t1-t5 from the case of the vehicle model A. That is, from data obtained previously, it is recognized that the water temperature of the vehicle model B in the time period t1-t5 is the value multiplied from the water temperature of the vehicle model A by 1.25. This is the rule of numerical transformation from the vehicle model A to the vehicle model B. That is, the factor of the rule of the numerical transformation from the vehicle model A to the vehicle model B in the time period t1-t5 is 1.25.

It will be assumed that the vehicle model C is changed from the vehicle model A in a part of ECU specifications, for example, related to the water temperature of a radiator or the like. Further, it will be assumed that, according to the ECU specifications of the vehicle model C, it is estimated that the temporal change in the water temperature of the vehicle model C is linear and the temporal change rate is for example 30, based on the result of comparison between the vehicle model A and the vehicle model B. FIG. 13C is a graph showing an example of an estimated temporal change in the water temperature of the vehicle model C. As shown in FIG. 13C, the time required for the water temperature of the vehicle model C to become 100° C. decreases by 33%, compared with the case of the vehicle model A, and the water temperature of the vehicle model C increases by 50%, during the time period t1-t4 for example, compared with the case of the vehicle model A.

Figure 13C:
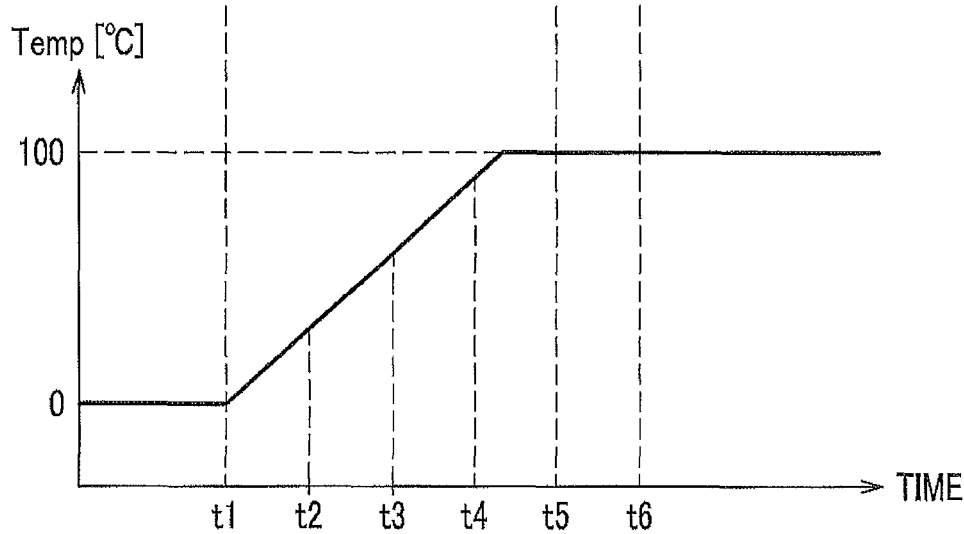

From the graph in FIG. 13C, for the time period, for example, time t1-t4 in a certain checking process, it is recognized that the vehicle model C can perform checking communication with the vehicle communication apparatus 10 by generating a value multiplied from the water temperature of the vehicle model A by 1.5 as the water temperature (virtual vehicle state information) of the vehicle model C. That is, regarding the water temperature during the time period t1-t4, the factor of the rule of the numerical transformation from the vehicle model A to the vehicle model C is 1.5.

Usually, in order to perform simulation of checking or the like of vehicles, it is necessary to obtain vehicle state information of respective individual vehicle models during having the vehicles run on a line, and a lot of time is required to obtain vehicle state information of all vehicle models. However, in the present embodiment, even for a vehicle model whose vehicle state information has not been obtained previously, it is possible to perform simulation, such as checking, by reflecting an amount of change to the vehicle state information of the base vehicle model.

Incidentally, the above-described vehicle model C may be not an existing actual vehicle, and may be an imaginary vehicle. For example, it is also possible to develop a vehicle model C by a model change from the vehicle model A as a base, and reflect an amount of change assumed in a case of performing this checking to a vehicle model C that does not yet exist. Herein, the model change is not limited to a minor change, and may be a full model change. Further, vehicle state information to which a change of amount is reflected is not limited to the water temperature, and may be, for example, the vehicle speed or the like. Still further, the rule of numerical transformation used for a vehicle model C is not limited to multiplication, and may be a combination of four arithmetic operations, nonlinear computation using, for example, a trigonometric function, or the like.

7-2. Second Concrete Example

A second concrete example is a concrete example of virtual vehicle state information generated by the vehicle simulator 1 by reflecting an amount of change in a case of assuming data obtained by changing data, which was a fixed value in driving pattern data obtained by the vehicle communication apparatus 10.

Among driving pattern data, such as the vehicle state information, obtained when an actual vehicle runs on a line, the above-described data, such as the water temperature or the vehicle speed, has a significant temporal change, however, the obtained driving pattern data also includes information, such as a signal without a temporal change. For example, the switches of plural onboard electrical components are set to OFF in the driving pattern data.

In the following, a case that an onboard electrical component is, for example, an air conditioner, and simulation, with driving pattern data during a time when the switch of this air conditioner is ON, is newly performed will be described, referring to FIG. 14A and FIG. 14B.

Figure 14A:
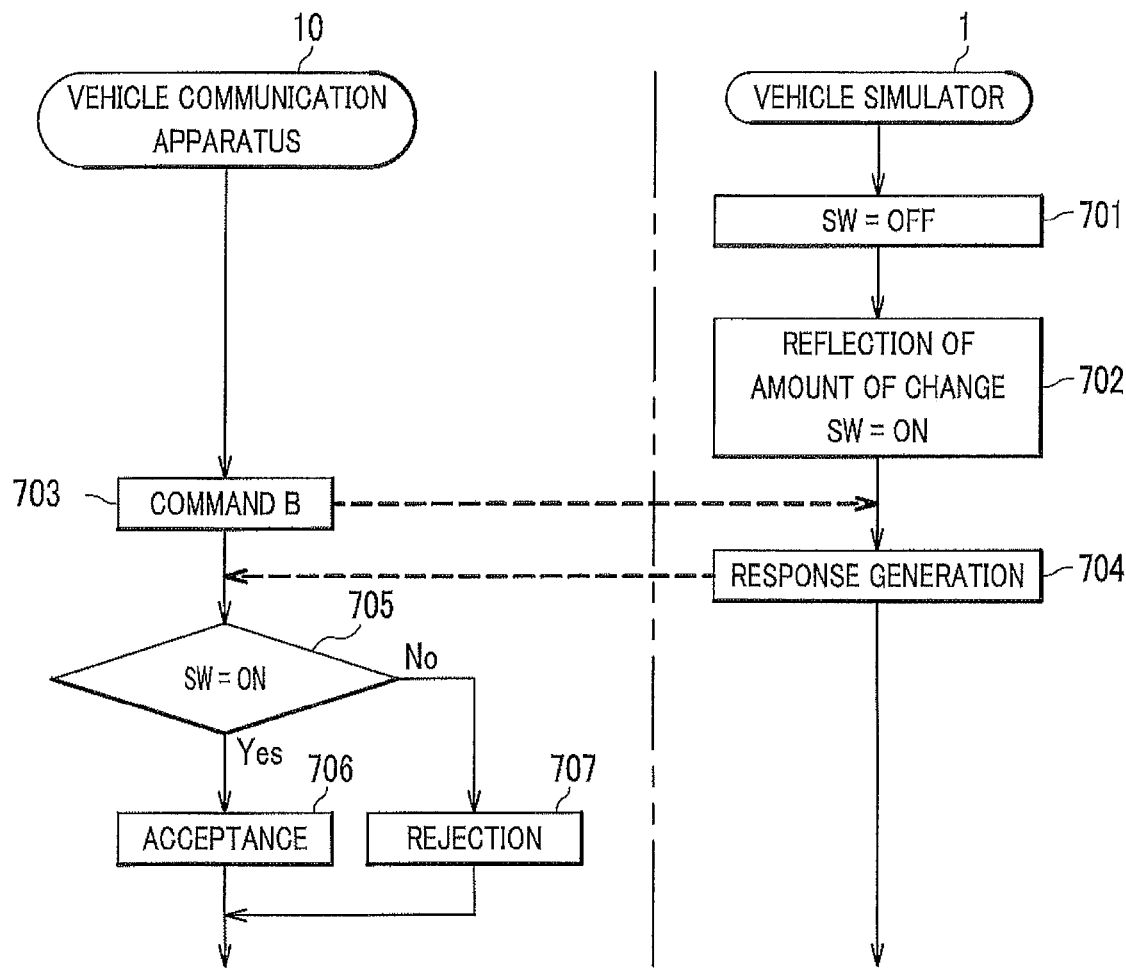

FIG. 14A is a sequence diagram representing the flow of a communication process between the vehicle simulator 1 and the vehicle communication apparatus 10. The vehicle simulator 1 simulates an actual vehicle and stores driving pattern data of the actual vehicle. In the driving pattern data of this actual vehicle, the switch signal of the air conditioner is OFF signal at time t1, t2, and t3, as shown in the virtuality line 711 in FIG. 14B. Herein, time t1 is a time before performing checking. Time t2 is the time at a start of the checking. Time t3 is the time of completing the checking. Further, a command of performing this checking will be referred to as command B.

In the initial state, as shown in FIG. 14A, the vehicle simulator 1 sets the switch signal of the air conditioner to OFF signal as vehicle state information (SW=OFF: 701).

Then, the user operates the vehicle simulator 1 at time t1 before performing checking. That is, the user performs switching operation that reflects an amount of change for a simulation to be additionally performed. Thus, the vehicle simulator 1 generates virtual vehicle state information and virtually sets the switch signal of the air conditioner to ON signal (SW=ON: 802). At this moment, the switch signal of the air conditioner is switched from OFF signal to ON signal at time t1, as shown by a thick solid line 712 in FIG. 14B.

Figure 14B:
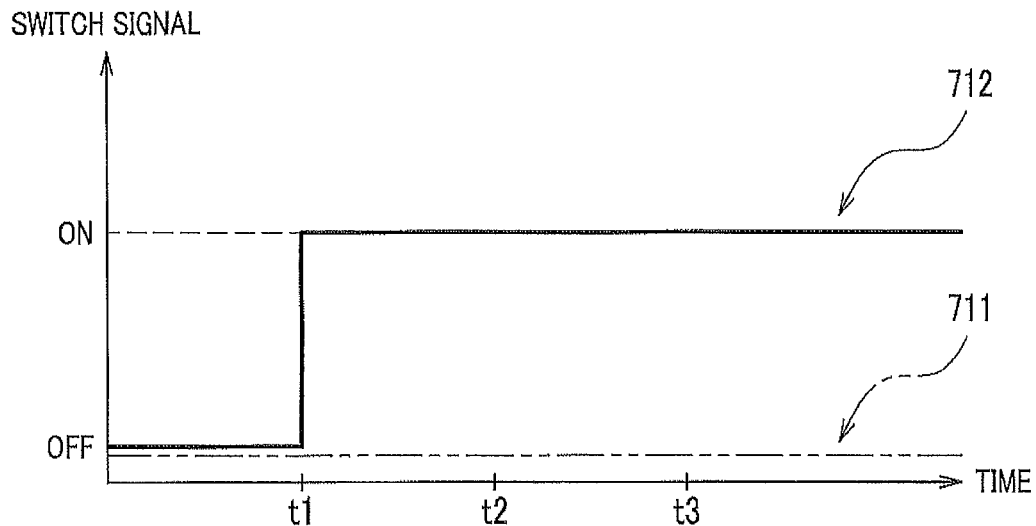

Then, at time t2 of starting the checking, as shown in FIG. 14B, the vehicle communication apparatus 10 transmits command B to the vehicle simulator 1 (702). Upon reception of command B, the vehicle simulator 1 performs the checking by command B, using the virtual vehicle state information representing ON signal of the switch signal of the air conditioner.

Then, at time t3 when the checking is complete, the vehicle simulator 1 generates a response, using virtual vehicle state information (704). This response includes a record representing that the checking was performed during when the switch signal of the air conditioner was ON signal. Incidentally, after the completion of the checking, the vehicle simulator 1 may switch the switch signal of the air conditioner to OFF signal.

The vehicle communication apparatus 10 confirms the response from the vehicle simulator 1, and determines whether or not the switch signal of the air conditioner was ON signal during the checking (705). If the switch signal of the air conditioner was ON signal (SW=ON) during the checking, it is determined that the result of the checking on the actual vehicle by simulation is acceptable (706).

On the other hand, in case that the user does not perform switching operation of the vehicle simulator 1, rejection of the result of checking is determined because the switch signal of the air conditioner remains OFF signal (SW=OFF) during the checking, as shown by the virtuality line 711 in FIG. 14B (707).

According to the present embodiment, even in a case where a certain checking is assumed to be performed from now on in a state, for example, that the switch of the air conditioner of an actual vehicle is ON as an assumed amount of change, it is possible to simulate checking communication between the vehicle communication apparatus 10 and an actual vehicle even without an actual vehicle by performing the checking communication between the vehicle communication apparatus 10 and the vehicle simulator 1 on which the user performs switching operation. Accordingly, it is possible, through simulation, to study implementability of a process in case of adding checking that requires switching operation of an actual vehicle or moving a process that requires switching operation of an actual vehicle.

Incidentally, an onboard electrical component accompanying switching operation is not limited to an air conditioner. Further, in addition to the operation of switching ON/OFF for an original function of an onboard electrical component, such as an air conditioner, operation by the user may be operation of switching communicatability and non-communicatability of an onboard electrical component.

7-3. Third Concrete Example

A third concrete example is a concrete example on virtual vehicle state information wherein, upon reception by the vehicle simulator 1 of a specific command from the vehicle communication apparatus 10, the virtual vehicle state information reflects an amount of change included in the specific command and is generated by changing a part of driving pattern data obtained by the vehicle communication apparatus 10.

The vehicle communication apparatus 10 obtains driving pattern data of vehicle state information or the like when an actual vehicle runs on a line. In this process of recording past data, the vehicle communication apparatus 10 transmits various commands to the actual vehicle. Specific commands among these commands become new commands by merely changing a numerical value, and it is possible to use the new commands.

For example, it will be assumed that checking was performed previously at a certain timing in a certain checking process in a state that the engine was stopped, in other words, checking was made in a state that the rotation speed of the engine (hereinafter, referred to as rotation speed NE) was made 0 rpm. Now, a case will be assumed wherein from now on the rotation speed NE is changed to 3000 rpm at the same timing in this checking process.

Figure 15A:
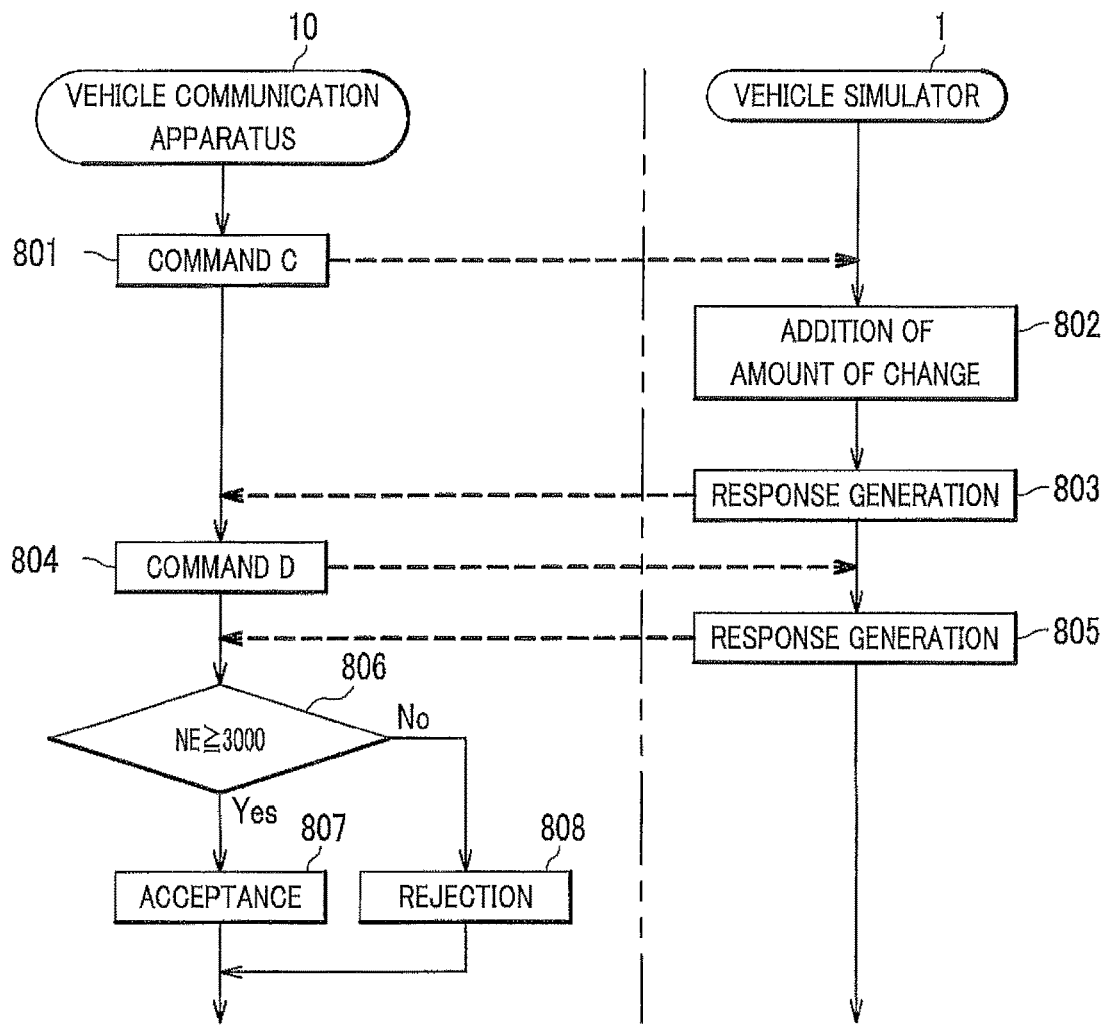

FIG. 15A is a sequence diagram showing the flow of the communication process between the vehicle simulator 1 and the vehicle communication apparatus 10. The vehicle simulator 1 simulates an actual vehicle and stores driving pattern data of the actual vehicle. In the driving pattern data of this actual vehicle, the rotation speed NE is 0 rpm at time t1, t2, as shown by a virtuality line 811 in FIG. 15B. Herein, time t1 is a time when the vehicle communication apparatus 10 makes a driving request to make the rotation speed NE 3000 rpm, and time t2 is a time when the vehicle communication apparatus 10 requests the current rotation speed NE.

In the following description, command C is a command of a driving request to make the rotation speed NE 3000 rpm. Command D is a command of a request for the current rotation speed NE.

As shown in FIG. 15A, first at time t1, the vehicle communication apparatus 10 transmits the command C to the vehicle simulator 1 (801). Upon reception of the command C, the vehicle simulator 1 adds an amount of change (3000) to a rotation speed (NE=0) detected as vehicle state information, and thus generates the rotation speed (NE=3000) as virtual vehicle state information (802). At this moment, the rotation speed is switched from 0 rpm to 3000 rpm at time t1, as shown by the thick solid line 812 in FIG. 15B.

Then, at time t2, the vehicle simulator 1 generates a response to the command C (803). This response notifies the fact of having received the command C. Incidentally, virtual vehicle state information may be generated after performing notification by this response.

At time t2, the vehicle communication apparatus 10 transmits command D to the vehicle simulator 1 (804). Upon reception of the command D, the vehicle simulator 1 generates a response to the command D, using the virtual vehicle state information (805). That is, the vehicle simulator 1 notifies the vehicle communication apparatus 10 of the current rotation speed (NE=3000) stored as the virtual vehicle state information, as a response. Incidentally, after time t2, the vehicle simulator 1 may reset the engine rotation speed to 0 rpm.

The vehicle communication apparatus 10 confirms the response from the vehicle simulator 1 and determines whether or not the rotation speed NE is higher than or equal to 3000 (806). If the rotation speed NE is higher than or equal to 3000 (NE≥3000), it is determined that the result of checking on the actual vehicle simulated in this simulation is acceptable (807).

Figure 15B:
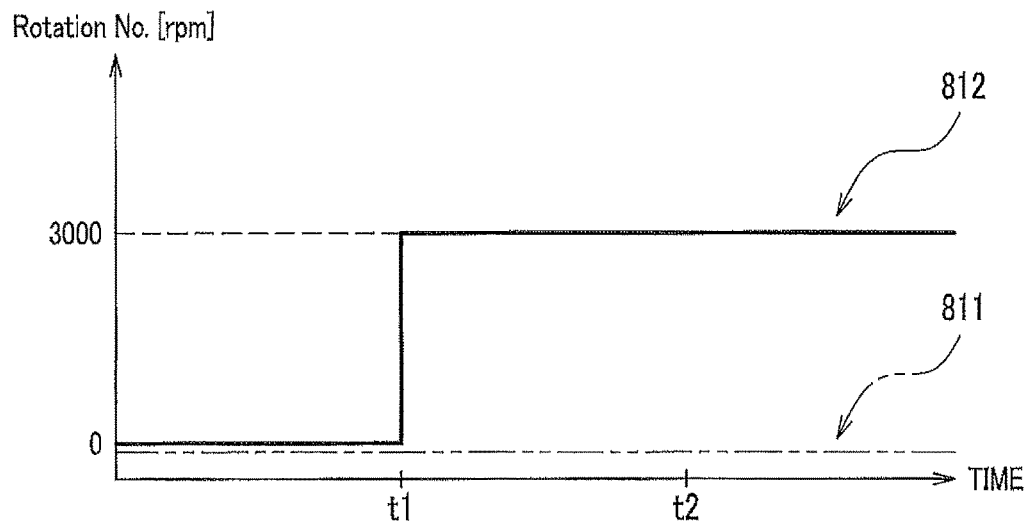

On the other hand, in case of a comparative example of not adding an amount of change by the vehicle simulator 1 at time t1, rejection of the result of checking is determined, as shown by the virtuality line 811 in FIG. 15B, because the rotation speed NE remains 0 rpm (811).

The manner of changing the rotation speed NE is not limited to the above-described example.

For example, in a case of performing checking, making the rotation speed NE 2000 rpm, the following modified examples 1-3 may be applied.
(Modified Example 1) To change the rotation speed NE to 3000 rpm at the same timing.
(Modified Example 2) To add a command of a driving request to change the rotation speed NE to 3000 rpm at another timing.
(Modified Example 3) To add a command of a driving request to again change the rotation speed NE to 2000 rpm at still another timing.

Further, although a case of adding an amount of change to a detected rotation speed NE has been described, an amount of change may be subtracted. Still further, a specific command to merely change a numeric value is not limited to changing the engine rotation speed.

As described above, the communication simulating system 100 related to an embodiment of the present invention reproduces vehicle state information in a checking process at a certain place under selected vehicle condition. Accordingly, the communication simulating system 100 can simulate the communication state of communication performed between the electrical systems 21, 22 mounted on the vehicle 20 and the vehicle communication apparatus 10 without an actual vehicle.

Further, the vehicle communication apparatus 10 related to an embodiment of the present invention performs communication with the communication simulating system 100 via the communication simulating system interface 12 and the communication simulating device 14, and can thereby simulate communication with the vehicle 20 via the vehicular interface 11.

A preferred embodiment of a communication simulating system and a vehicle communication apparatus according to the present invention has been described above, however, the present invention is not limited to the foregoing embodiment. For example, in the configuration example of the communication simulating system 100 shown in FIG. 5, the processing and editing unit 134 is provided in the mode, however, arrangement may be made without providing the processing and editing unit 134.

Further, although a laptop is shown as the communication simulating system 100, without being limited thereto, the communication simulating system 100 may be configured by a portable information terminal, a desktop computer, a workstation, a cloud server, or the like.

Further, the foregoing embodiment has been described with an assumption that the vehicle communication is testing communication, however, the present invention is not limited thereto, and the vehicle communication may be communication for learning or writing-in wherein similar advantages can be obtained.

Still further, although an embodiment in which one vehicle communication apparatus 10 is connected via the communication simulating device 14 to the communication simulating system 100 is shown in the drawings, the invention is not limited thereto. In a case of connecting one vehicle communication apparatus 10, the vehicle communication apparatus 10 is connected to the communication simulating system 100 via the communication simulating device 14 by a cross cable. In a case of connecting plural vehicle communication apparatuses 10, the vehicle communication apparatuses 10 can be connected to the communication simulating system 100 via the communication simulating device 14 by straight cables through a hub. Incidentally, such a cross cable and straight cables correspond to the cable of the communication simulating system interface 12.

Yet further, an embodiment in which the cable of the vehicular interface 11 is connected to the vehicle communication apparatus 10 is shown, and an embodiment in which the cable of the communication simulating system interface 12 is connected to the vehicle communication apparatus 10 is shown, however, these cables may be connected to each other in another embodiment. That is, the root end of the cable of the communication simulating system interface 12 may be connected to the tip end of the cable of the vehicular interface 11. In this case, for example, an OBD2 connector (female) connectable to an OBD2 connector (male) at the tip end of the vehicular interface 11 can be arranged at the root end of the cable of the communication simulating system interface 12, attachably and detachably. Then, if it is desired to connect the vehicle communication apparatus 10 to the vehicle simulator 1, the tip end of the cable of the communication simulating system interface 12 is connected to the vehicle simulator 1 via the communication simulating device 14, in a state that the vehicular interface 11 and the communication simulating system interface 12 are connected to each other. If it is desired to connect the vehicle communication apparatus 10 to the vehicle 20, the OBD2 connector at the tip end of the cable of the vehicular interface 11 is connected to the vehicle 20, in a state that the communication simulating system interface 12 is detached.

Still further, for the vehicle communication apparatus 10, in an embodiment in which the cable of the vehicular interface 11 and the cable of the communication simulating system interface 12 are connected to each other, arrangement may be made such that the tip end side of the cable of the communication simulating system interface 12 is branched into two; for example, a RJ45 connector is provided at the tip end of one branch; and, for example, an OBD2 connector (male) is provided at the tip end of the other one branch. Thus, in case of connecting the vehicle communication apparatus 10 via the communication simulating device 14 to the vehicle simulator 1 or the vehicle 20, it is unnecessary to attach and detach the communication simulating system interface 12.

DESCRIPTION OF REFERENCE SYMBOLS

1: vehicle simulator
10 (10a, 10b): vehicle communication apparatus
11: vehicular interface
12: communication simulating system interface
14: communication simulating device
18: information processing terminal device
181: communication definition file
20: vehicle
21, 22: electrical system
23: sensor group
24: communication interface
25: operation section
31, 32, 33, 34: ECU
41: microprocessor 42: input/output section
43: communication module
44: communication definition file
51, 52, 53: sensor
100: communication simulating system
110: communication interface (communication content input unit)
111: input-output interface
120: storage section (storage unit)
121: vehicle condition database
122, 123: communication definition file
130: processing section (processing unit)
131: communication recording unit
132: vehicle state information obtaining unit
133: communication control unit
134: processing and editing unit
141: request receiving unit
142: determining unit
143: responding unit

The invention claimed is:

1. A communication simulating system that simulates communication between a given electronic control unit (ECU) in one of plural vehicle electrical systems mounted on a vehicle and a vehicle communication apparatus, using loci data taken in actual conditions involving one or more vehicles, for evaluation of a new condition, in a state of the communication simulating system having no connection with any vehicle,
wherein the vehicle communication apparatus is normally connected from outside of the vehicle to the plural vehicle electrical systems to check operation state of the respective vehicle electrical systems,
the communication simulating system comprising:
a processor;
a display unit; and
a storage unit storing communication definition files, which specify communication processes to be executed in predetermined processes by ECUs,
wherein the processor is configured to:
receive, in a state of the communication simulating system having no connection with any vehicle, from communication log data taken in actual conditions involving one or more vehicles, pieces of vehicle state information as results of communication between vehicle electrical systems of the one or more vehicles and the vehicle communication apparatus in given processes performed at given places;
record the received pieces of vehicle state information into a vehicle condition database in the storage unit as vehicle conditions, each having the vehicle state information associated with the corresponding process, place, and vehicle;
obtain a vehicle condition from the vehicle condition database, in response to either a user or a program selecting said vehicle condition, obtain vehicle state information associated with the selected vehicle condition;
display the obtained vehicle state information on the display unit;
modify the obtained vehicle state information, in response to the user modifying said vehicle state information on the display unit for a planned vehicle condition;
obtain a communication definition file from the storage unit, according to a selected process associated with the selected vehicle condition;
reflect the modified vehicle state information into an ECU specification in the communication simulating system for the selected process; and
perform a communication process with the vehicle communication apparatus, in a state of the vehicle communication apparatus being connected to the communication simulating system in place of a vehicle, according to a communication process specified in the obtained communication definition file and the ECU specification, to determine whether the selected process is successfully implemented with the ECU specification for the planned vehicle condition.

2. The communication simulating system according to claim 1,
wherein the communication in the given processes performed at the given places is one of checking communication for the vehicle communication apparatus to check operation of the vehicle electrical systems, learning communication for the vehicle communication apparatus to perform learning, and writing-in communication for the vehicle communication apparatus to write in data.

3. The communication simulating system according to claim 2,
wherein the vehicle state information is information of vehicle state affected by at least one of equipment and environment of an individual place.

4. The communication simulating system according to claim 1,
wherein the vehicle state information is information of vehicle state affected by at least one of equipment and environment of an individual place.

5. The communication simulating system according to claim 1,
wherein the processor is further configured to perform a communication process with the vehicle communication apparatus on the selected vehicle condition, using at least one kind of virtual vehicle state information that is generated with reflection of an amount of change assumed on the at least one kind of vehicle state information.

6. The communication simulating system according to claim 5,
wherein a predetermined numerical value transformation rule is used that is obtained in advance from comparison between vehicle state information included in communication results detected by a vehicle of one model and vehicle state information included in communication results detected by a vehicle of a similar model to the one model, to generate the virtual vehicle state information by numerical transformation of the vehicle state information included in the communication results detected by the vehicle of the one model, and
wherein the processor is further configured to use the virtual vehicle state information to simulate communication in which a vehicle of another model, having an amount of change from the one model reflected, responds to a request from the vehicle communication apparatus.

7. The communication simulating system according to claim 5,
wherein the virtual vehicle state information is virtual communication information generated in association with the vehicle state information included in the communication results detected by the vehicle, and
wherein the processor is further configured to use the virtual vehicle state information to simulate communication in which a vehicle having detected communication results including the vehicle state information responds to a request from the vehicle communication apparatus.

8. The communication simulating system according to claim 5,
wherein the virtual vehicle state information is generated by numerical transformation that adds or subtracts a numerical value required by a prescribed specific command from the vehicle communication apparatus, to or from vehicle state information included in communication results detected by the vehicle, and
wherein the processor is further configured to use the virtual vehicle state information to simulate communication in which a vehicle having detected communication results including the vehicle state information responds to the specific command from the vehicle communication apparatus.

9. The communication simulating system according to claim 1,
wherein the vehicle communication apparatus automatically sends a request to the communication simulating system at predetermined time intervals.

10. A communication simulating system that simulates checking communication between a given electronic control unit (ECU) in one of plural vehicle electrical systems mounted on a vehicle and a vehicle communication apparatus, and between the vehicle communication apparatus and an information processing terminal device attached to equipment for managing necessary information at a given checking place, using loci data taken in actual conditions involving one or more vehicles, for evaluation of a new condition, in a state of the communication simulating system having no connection with any vehicle,
wherein the vehicle communication apparatus is normally connected from outside of the vehicle to the plural vehicle electrical systems to check operation state of the respective vehicle electrical systems and is communicatably and wirelessly connected with the information processing terminal device at the given checking place,
the communication simulating system comprising:
a processor;
a display unit; and
a storage unit storing the communication definition files, which specify communication processes to be executed in predetermined checking processes by ECUs and the information processing terminal device,
wherein the processor is configured to:
receive, in a state of the communication simulating system having no connection with any vehicle, from communication log data taken in actual conditions involving one or more vehicles, pieces of vehicle state information as results of communication between vehicle electrical systems of the one or more vehicles and the vehicle communication apparatus, and between the information processing terminal device and the vehicle communication apparatus, in checking processes performed at the given checking place;
record the received pieces of vehicle state information into a vehicle condition database in the storage unit as vehicle conditions, each having the vehicle state information associated with the corresponding checking process, checking place, and vehicle;
obtain a vehicle condition from the vehicle condition database, in response to either a user or a program selecting said vehicle condition;
obtain vehicle state information from the vehicle condition database, which is associated with the selected vehicle condition;
display the obtained vehicle state information on the display unit;
modify the obtained vehicle state information, in response to the user modifying said vehicle state information on the display unit for a planned vehicle condition;
obtain communication definition files from the storage unit, according to a selected checking process associated with the selected vehicle condition;
reflect the modified vehicle state information into an ECU specification in the communication simulating system for the selected process; and
perform communication with the vehicle communication apparatus via wired communication in the selected checking process, in a state of the vehicle communication apparatus being connected to the communication simulating system in place of a vehicle but having no connection with the information processing terminal device, according to communication processes specified in the obtained communication definition files and the ECU specification to determine whether the selected checking process is successfully implemented with the ECU specification for the planned vehicle condition,
wherein the communication is normally executed by an ECU of the vehicle with the vehicle communication apparatus via wired communication in parallel with communication executed by the information processing terminal device with the vehicle communication apparatus via wireless communication.

11. The communication simulating system according to claim 10,
wherein the vehicle state information is information of vehicle state affected by at least one of equipment and environment of an individual place.

12. The communication simulating system according to claim 10,
wherein the vehicle communication apparatus automatically sends a request to the communication simulating system at predetermined time intervals.

13. A communication simulating method for use in a communication simulating system that simulates communication between a given electronic control unit (ECU) in one of plural vehicle electrical systems mounted on a vehicle and a vehicle communication apparatus, using log data taken in actual conditions involving one or more vehicles, for evaluation of a new condition, in a state of the communication simulating system having no connection with any vehicle,
wherein the vehicle communication apparatus is normally connected from outside of the vehicle to the plural vehicle electrical systems to check operation state of the respective vehicle electrical systems, and the communication simulating system includes: a processor; a display unit; and a storage unit storing communication definition files, which specify communication processes to be executed in predetermined processes by ECUs,
the method comprising:
obtaining a vehicle condition from the storage unit in a state of the communication simulating system having no connection with any vehicle, in response to either a user or a program selecting said vehicle condition in a state that the storage unit further stores communication log data taken in actual conditions involving one or more vehicles as vehicle conditions, each including vehicle state information as results of communication between a given vehicle and the vehicle communication apparatus in a given process performed at a given place in association with the corresponding process, place, and vehicle;

obtaining vehicle state information associated with the selected vehicle condition;

displaying the obtained vehicle state information on the display unit;

modifying the obtained vehicle state information, in response to the user modifying said vehicle state information on the display unit for a planned vehicle condition;

obtaining a communication definition file from the storage unit, according to a selected process associated with the selected vehicle condition;

reflecting the modified vehicle state information into an ECU specification in the communication simulating system for the selected process; and performing a communication process with the vehicle communication apparatus, in a state of the vehicle communication apparatus being connected to the communication simulating system in place of a vehicle, according to a communication process specified in the obtained communication definition file and the ECU specification, to determine whether the selected process is successfully implemented with the ECU specification for the planned vehicle condition.

14. The communication simulating method according to claim 13,
wherein the communication in the given processes performed at the given places is one of checking communication for the vehicle communication apparatus to check operation of the vehicle electrical systems, learning communication for the vehicle communication apparatus to perform learning, and writing-in communication for the vehicle communication apparatus to write in data.

15. The communication simulating method according to claim 14,
wherein the vehicle state information is information of vehicle state affected by at least one of equipment and environment of an individual place.

16. The communication simulating method according to claim 13,
wherein the vehicle state information is information of vehicle state affected by at least one of equipment and environment of an individual place.

17. The communication simulating method according to claim 13,
wherein in the step of performing communication, the method performs the communication with the vehicle communication apparatus on the selected vehicle condition, using at least one kind of virtual vehicle state information that is generated with reflection of an amount of change assumed on the at least one kind of vehicle state information.

18. The communication simulating method according to claim 17,
wherein a predetermined numerical value transformation rule is used that is obtained in advance from comparison between vehicle state information included in communication results detected by a vehicle of one model and vehicle state information included in communication results detected by a vehicle of a similar model to the one model, to generate the virtual vehicle state information by numerical transformation of the vehicle state information included in the communication results detected by the vehicle of the one model, and
wherein, in the step of performing the communication, the method uses the virtual vehicle state information to simulate communication in which a vehicle of another model, having an amount of change from the one model reflected, responds to a request from the vehicle communication apparatus.

19. The communication simulating method according to claim 17,
wherein the virtual vehicle state information is virtual communication information generated in association with the vehicle state information included in the communication results detected by the vehicle, and
wherein, in the step of performing the communication, the method uses the virtual vehicle state information to simulate communication in which a vehicle having detected communication results including the vehicle state information responds to a request from the vehicle communication apparatus.

20. The communication simulating method according to claim 17,
wherein the virtual vehicle state information is generated by numerical transformation that adds or subtracts a numerical value required by a prescribed specific command from the vehicle communication apparatus, to or from vehicle state information included in communication results detected by the vehicle, and
wherein, in the step of performing the communication, the method uses the virtual vehicle state information to simulate communication in which a vehicle having detected communication results including the vehicle state information responds to the specific command from the vehicle communication apparatus.

21. The communication simulating method according to claim 13, wherein the vehicle communication apparatus automatically sends a request to the communication simulating system at predetermined time intervals.

22. A communication simulating method for use in a communication simulating system that simulates checking communication between a given electronic control unit (ECU) in one of plural vehicle electrical systems mounted on a vehicle and a vehicle communication apparatus, and between the vehicle communication apparatus and an information processing terminal device attached to equipment for managing necessary information at a given checking place, using log data taken in actual conditions involving one or more vehicles, for evaluation of a new condition, in a state of the communication simulating system having no connection with any vehicle,
wherein the vehicle communication apparatus is normally connected from outside of the vehicle to the plural vehicle electrical systems to check operation state of the respective vehicle electrical systems and is communicatably and wirelessly connected with the information processing terminal device at the given checking place, and the communication simulating system includes: a processor; a display unit; and a storage unit storing communication definition files, which specify communication processes to be executed in predetermined checking processes by ECUs and the information processing terminal device, the method comprising:

obtaining a vehicle condition from the storage unit in a state of the communication simulating system having no connection with any vehicle, in response to either a user or a program selecting said vehicle condition in a state that the storage unit further stores communication log data taken in actual conditions involving one or more vehicles as vehicle conditions, each including vehicle state information as results of communication between a given vehicle and the vehicle communication apparatus in a given process given processes performed at a given place in association with the corresponding process, place, and vehicle;

obtaining vehicle state information associated with the selected vehicle condition;

displaying the obtained vehicle state information on the display unit;

modifying the obtained vehicle state information, in response to the user modifying said vehicle state information on the display unit for a planned vehicle condition;

obtaining communication definition files from the storage unit, according to a selected checking process associated with the selected vehicle condition;

reflecting the modified vehicle state information into an ECU specification in the communication simulating system for the selected process; and performing communication with the vehicle communication apparatus via wired communication in the selected checking process, in a state of the vehicle communication apparatus being connected to the communication simulating system in place of a vehicle but having no connection with the information processing terminal device, according to communication processes specified in the obtained communication definition files and the ECU specification to determine whether the selected checking process is successfully implemented with the ECU specification for the planned vehicle condition, wherein the communication is normally executed by an ECU of the vehicle with the vehicle communication apparatus via wired communication in parallel with communication executed by the information processing terminal device with the vehicle communication apparatus via wireless communication.

23. The communication simulating method according to claim 22, wherein the vehicle state information is information of vehicle state affected by at least one of equipment and environment of an individual place.

24. A vehicle communication apparatus that is communicatably wire-connected to plural vehicle electrical systems mounted on a vehicle from outside of the vehicle via a vehicular interface and is communicatably and wirelessly connected with an information processing terminal device attached to equipment for managing necessary information at a given checking place, the apparatus comprising:

a communication simulating system interface communicatably connected with the communication simulating system according to claim 1, wherein the apparatus transmits an inquiry as to whether or not the selected process is implementable, based on the vehicle state information at the given place, to the communication simulating system via the communication simulating system interface, and the apparatus receives a response, to the inquiry, from the communication simulating system via the communication simulating system interface.

25. The communication simulating method according to claim 22, wherein the vehicle communication apparatus automatically sends a request to the communication simulating system at predetermined time intervals.

* * * * *